(12) United States Patent
Hunt et al.

(10) Patent No.: US 6,210,592 B1
(45) Date of Patent: Apr. 3, 2001

(54) DEPOSITION OF RESISTOR MATERIALS DIRECTLY ON INSULATING SUBSTRATES

(75) Inventors: Andrew T. Hunt, Atlanta; Wen-Yi Lin, Doraville; Shara S. Shoup, Woodstock, all of GA (US); Richard W. Carpenter, Johnson City, NY (US)

(73) Assignee: Morton International, Inc., Chicago, IL (US)

( * ) Notice: Subject to any disclaimer, the term of this patent is extended or adjusted under 35 U.S.C. 154(b) by 0 days.

(21) Appl. No.: 09/069,679

(22) Filed: Apr. 29, 1998

(51) Int. Cl.[7] ............................. H01C 1/12; H01B 13/00
(52) U.S. Cl. ............................. 216/16; 216/20; 338/308; 427/96; 427/101
(58) Field of Search .................. 216/16, 20; 338/308, 338/309; 427/96, 101; 438/384

(56) References Cited

U.S. PATENT DOCUMENTS

| 3,691,007 | * | 9/1972 | Parlou et al. ................ 428/601 |
| 3,808,576 | | 4/1974 | Castonguay et al. ........... 338/309 |
| 4,028,657 | * | 6/1977 | Reichelt ........................ 338/307 |
| 4,808,967 | | 2/1989 | Rice et al. ..................... 338/309 |
| 4,892,776 | | 1/1990 | Rice ............................. 428/209 |
| 5,243,320 | * | 9/1993 | Clouser et al. ................ 338/308 |
| 5,336,391 | | 8/1994 | Rice ............................. 205/152 |
| 5,652,021 | | 7/1997 | Hunt et al. .................. 427/248.1 |
| 5,997,956 | * | 12/1999 | Hunt et al. ................... 427/450 |

FOREIGN PATENT DOCUMENTS

| WO 86/07100 | 12/1986 | (WO) . |
| WO 89/02212 | 3/1989 | (WO) . |
| WO 95/03168 | 2/1995 | (WO) . |

OTHER PUBLICATIONS

U.S. Patent Appl. S.N. 08/691,853, filed Aug. 2, 1996, "Chemical Vapor Deposition and Powder Formation Using Thermal Spray with near supercrtical and supercritical fluid solutions" Hunt et al.*

U.S. Patent App. S.N. 08/691,853, filed Aug. 2,1996, "Chemical Vapor Deposition and Powder Formation Using Thermal Spray With Near Supercritical and Supercritical Fluid Solutions", Hunt et al.

* cited by examiner

Primary Examiner—Randy Gulakowski
Assistant Examiner—Shamim Ahmed
(74) Attorney, Agent, or Firm—Wayne E. Nacker; Darryl P. Frickey

(57) ABSTRACT

Resistors are formed by selective etching from layered thin film material comprising an insulating substrate, a resistive material which is a mixture of a zero valence metal and a dielectric material, and a layer of conductive material.

16 Claims, 7 Drawing Sheets

DEPOSITION OF RESISTOR MATERIALS DIRECTLY ON INSULATING SUBSTRATES

The present invention is directed to the formation of thin layer resistors, preferably for printed circuitry, such thin layers being capable of being embedded within a printed circuit board. In particular, the invention is directed to forming thin layer resistors from thin layers of resistive material which may be deposited by combustion chemical vapor deposition.

BACKGROUND OF THE INVENTION

Combustion chemical vapor deposition ("CCVD"), a recently invented CVD technique, allows for open atmosphere deposition of thin films. The CCVD process offers several advantages over other thin-film technologies, including traditional CVD. The key advantage of CCVD is its ability to deposit films in the open atmosphere without any costly furnace, vacuum, or reaction chamber. As a result, the initial system capitalization requirement can be reduced up to 90% compared to a vacuum based system. Instead of a specialized environment, which is required by other technologies, a combustion flame provides the necessary environment for the deposition of elemental constituents from solution, vapor, or gas sources. The precursors are generally dissolved in a solvent that also acts as the combustible fuel. Depositions can be performed at atmospheric pressure and temperature within an exhaust hood, outdoors, or within a chamber for control of the surrounding gasses or pressure.

Because CCVD generally uses solutions, a significant advantage of this technology is that it allows rapid and simple changes in dopants and stoichiometries which eases deposition of complex films. The CCVD technique generally uses inexpensive, soluble precursors. In addition, precursor vapor pressures do not play a role in CCVD because the dissolution process provides the energy for the creation of the necessary ionic constituents. By adjusting solution concentrations and constituents, a wide range of stoichiometries can be deposited quickly and easily. Additionally, the CCVD process allows both chemical composition and physical structure of the deposited film to be tailored to the requirements of the specific application.

Unlike conventional CVD, the CCVD process is not confined to an expensive, inflexible, low-pressure reaction chamber. Therefore, the deposition flame, or bank of flames, can be moved across the substrate to easily coat large and/or complex surface areas. Because the CCVD process is not limited to specialized environments, the user can continuously feed materials into the coating area without disruption, thereby permitting batch processing. Moreover, the user can limit deposition to specific areas of a substrate by simply controlling the dwell time of the flame(s) on those areas. Finally, the CCVD technology generally uses halogen-free chemical precursors having significantly reduced negative environmental impact.

Numerous materials have been deposited via CCVD technology with the combustion of a premixed precursor solution as the sole heat source. This inexpensive and flexible film deposition technique permits broad use of thin film technology. The CCVD process has much of the same flexibility as thermal spraying, yet creates quality, conformal films like those associated with conventional CVD. With CCVD processing, a desired phase can be deposited in a few days and at relatively low cost.

A preferred embodiment of the CCVD process is described in detail in U.S. Application Ser. No. 08/691,853 filed Aug. 2, 1996, the teachings of which are incorporated herein by reference. In accordance with that application, a CCVD produces vapor formed films, powders and nanophase coatings from near-supercritical liquids and supercritical fluids. Preferably, a liquid or liquid-like solution fluid containing chemical precursor(s) is formed. The solution fluid is regulated to near or above the critical pressure and is then heated to near the supercritical temperature just prior to being released through a restriction or nozzle which results in a gas entrained very finely atomized or vaporized solution fluid. The solution fluid vapor is combusted to form a flame or is entered into a flame or electric torch plasma, and the precursor(s) react to the desired phase in the flame or plasma or on the substrate surface. Due to the high temperature of the plasma much of the precursor will react prior to the substrate surface. A substrate is positioned near or in the flame or electric plasma, and a coating is deposited. Alternatively, the material formed can be collected as a nanophase powder.

Very fine atomization, nebulization, vaporization or gasification is achieved using solution fluids near or above the critical pressure and near the critical temperature. The dissolved chemical precursor(s) need not have high vapor pressure, but high vapor pressure precursors can work well or better than lower vapor pressure precursors. By heating the solution fluid just prior to or at the end of the nozzle or restriction tube (atomizing device), the available time for precursor chemical reaction or dissolution prior to atomization is minimized. This method can be used to deposit coatings from various metalorganics and inorganic precursors. The fluid solution solvent can be selected from any liquid or supercritical fluid in which the precursor(s) can form a solution. The liquid or fluid solvent by itself can consist of a mixture of different compounds.

A reduction in the supercritical temperature of the reagent containing fluid produces superior coatings. Many of these fluids are not stable as liquids at STP, and must be combined in a pressure cylinder or at a low temperature. To ease the formation of a liquid or fluid solution which can only exist at pressures greater than ambient, the chemical precursor(s) are optionally first dissolved in primary solvent that is stable at ambient pressure. This solution is placed in a pressure capable container, and then the secondary (or main) liquid or fluid (into which the primary solution is miscible) is added. The main liquid or fluid has a lower supercritical temperature, and results in a lowering of the maximum temperature needed for the desired degree of nebulization. By forming a high concentration primary solution, much of the resultant lower concentration solution is composed of secondary and possible additional solution compounds. Generally, the higher the ratio of a given compound in a given solution, the more the solution properties behave like that compound. These additional liquids and fluids are chosen to aid in the very fine atomization, vaporization or gasification of the chemical precursor(s) containing solution. Choosing a final solution mixture with low supercritical temperature additionally minimizes the occurrence of chemical precursors reacting inside the atomization apparatus, as well as lowering or eliminating the need to heat the solution at the release area. In some instances the solution may be cooled prior to the release area so that solubility and fluid stability are maintained. One skilled in the art of supercritical fluid solutions could determine various possible solution mixtures without undue experimentation. Optionally, a pressure vessel with a glass window, or with optical fibers and a monitor, allows visual determination of miscibility and solute-solvent compatibility.

Conversely, if in-line filters become clogged or precipitant is found remaining in the main container, an incompatibility under those conditions may have occurred.

Another advantage is that release of fluids near or above their supercritical point results in a rapid expansion forming a high speed gas-vapor stream. High velocity gas streams effectively reduce the gas diffusion boundary layer in front of the deposition surface which, in turn, improves film quality and deposition efficiency. When the stream velocities are above the flame velocity, a pilot light or other ignition means must be used to form a steady state flame. In some instances two or more pilots may be needed to ensure complete combustion. With the plasma torch, no pilot lights are needed, and high velocities can be easily achieved by following operational conditions known by one of ordinary skill in the art.

The solute-containing fluid need not be the fuel for the combustion. Noncombustible fluids like water $N_2O$ or $CO_2$, or difficult to combust fluids like ammonia, can be used to dissolve the precursors or can serve as the secondary solution compound. These are then expanded into a flame or plasma torch which provides the environment for the precursors to react. The depositions can be performed above, below or at ambient pressure. Plasma torches work well at reduced pressures. Flames can be stable down to 10 torr, and operate well at high pressures. Cool flames of even less than 500° C. can be formed at lower pressures. While both can operate in the open atmosphere, it can be advantageous to practice the methods of the invention in a reaction chamber under a controlled atmosphere to keep airborne impurities from being entrained into the resulting coating. Many electrical and optical coating applications require that no such impurities be present in the coating. These applications normally require thin films, but thicker films for thermal barrier, corrosion and wear applications can also be deposited.

Further bulk material can be grown, including single crystals, by extending the deposition time even further. The faster epitaxial deposition rates provided by higher deposition temperatures, due to higher diffusion rates, can be necessary for the deposition of single crystal thick films or bulk material.

CCVD is a flame process which utilizes oxygen. While it may be possible using CCVD to deposit oxygen-reactive materials with CCVD by depositing in the reducing portions of the flame, a better technique for depositing oxygen reactive materials, such as nickel, is a related process described in U.S. patent application Ser. No. 09/067,975, filed the same date as the instant application, the teachings of which are incorporated herein by reference.

The invention described in referenced U.S. patent application Ser. No. 09/067,975 provides an apparatus and method for chemical vapor deposition wherein the atmosphere in a coating deposition zone is established by carefully controlling and shielding the materials fed to form the coating and by causing the gases removed from the deposition zone to pass through a barrier zone wherein they flow away from said deposition zone at an average velocity greater than 50 feet per minute, and preferably greater than 100 feet per minute. The rapid gas flow through the barrier zone essentially precludes the migration of gases from the ambient atmosphere to the deposition zone where they could react with the coating or the materials from which the coating is derived. Careful control of the materials used to form the coating can be provided by feeding the coating precursors in a fixed proportion in a liquid media. The liquid media is atomized as it is fed to a reaction zone wherein the liquid media is vaporized and the coating precursors react to form reacted coating precursors. Alternatively, the coating precursor(s) can be fed as a gas, either as itself or as a mixture in a carrier gas. The reacted coating precursors are often composed of partially, fully and fractionally reacted components, which can flow as a plasma to the deposition zone. The reacted coating precursors contact and deposit the coating on the surface of the substrate in the deposition zone. A curtain of flowing inert gases may be provided around the reaction zone to shield the reactive coating materials/plasma in that zone from contamination with the materials used in the surrounding apparatus or with components of the ambient atmosphere.

The vaporization of the liquid media and reaction of the coating precursors in the reaction zone requires an input of energy. The required energy can be provided from various sources, such as electrical resistance heating, induction heating, microwave heating, RF heating, hot surface heating and/or mixing with hot inert gas.

Herein, non-combustion process will be referred to as "Controlled Atmosphere Combustion Chemical Vapor Deposition" (CACCVD). This technique provides a relatively controlled rate of energy input, enabling high rates of coating deposition. In some preferred cases, the liquid media and/or a secondary gas used to atomize the liquid media can be a combustible fuel used in the CACCVD. Particularly important is the capability of CACCVD to form high quality adherent deposits at or about atmospheric pressure, thereby avoiding the need to be conducted in elaborate vacuum or similar isolation housings. For these reasons, in many cases, CACCVD thin film coatings can be applied in situ, or "in the field", where the substrate is located.

Combustion chemical vapor deposition (CCVD) is not suitable for those coating applications which require an oxygen free environment. For such applications, CACCVD, which employs non-combustion energy sources such as hot gases, heated tubes, radiant energy, microwave and energized photons as with infrared or laser sources are suitable. In these applications it is important that all of the liquids and gases used be oxygen-free. The coating precursors can be fed in solution or suspension in liquids such as ammonia or propane which are suitable for the deposit of nitrides or carbides, respectively.

CACCVD processes and apparatus provide control over the deposition zone atmosphere, thereby enabling the production of sensitive coatings on temperature sensitive or vacuum sensitive substrates, which substrates can be larger than could otherwise be processed by conventional vacuum chamber deposition techniques.

A further advantage of CACCVD is its ability to coat substrates without needing additional energy supplied to the substrate. Accordingly, this system allows substrates to be coated which previously could not withstand the temperatures to which substrates were subjected by most previous systems. For instance, nickel coatings can be provided on polyimide sheet substrates without causing deformation of the substrate. Previously atmospheric pressure deposition techniques were unable to provide chemical vapor deposition of metallic nickel because of its strong affinity to oxygen, while vacuum processing of polyimide sheet substrates was problematical due to its outgassing of water and tendency toward dimensional instability when subjected to heat and vacuum.

SUMMARY OF THE INVENTION

Figure 1:
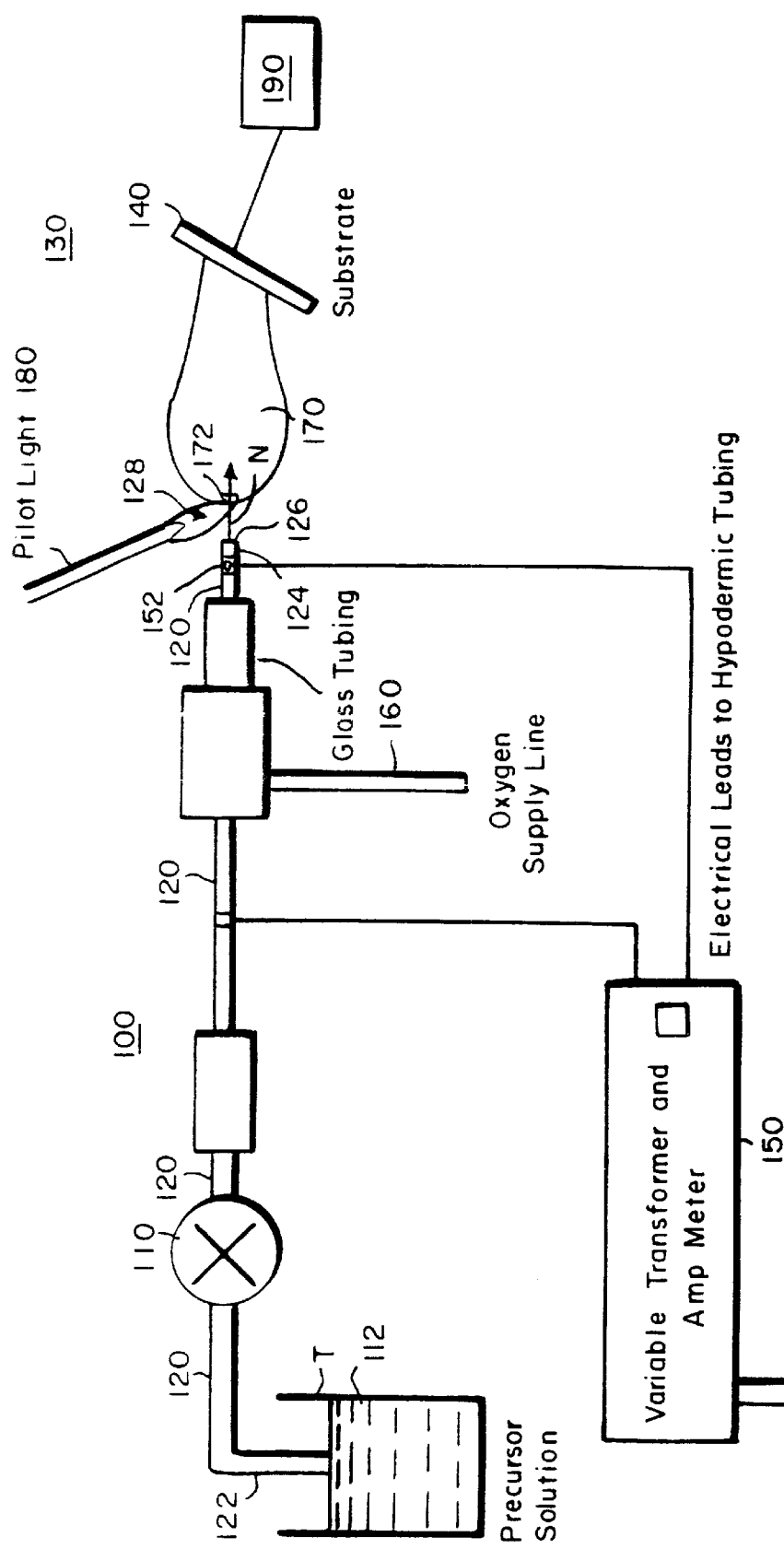
FIG. 1 shows a schematic diagram of the apparatus of the invention.

In accordance with the present invention thin layer resistors are formed on an insulating substrate, which resistors may be embedded within a printed circuit board. On an insulating substrate is formed a thin layer of resistive material. Preferred resistive materials which form the thin layers are homogeneous mixtures of metals, such as platinum, and dielectric materials, such as silica or alumina. Even minor amounts of dielectric material admixed with a metal significantly increase the resistance of the metal. Preferably, the resistive material is deposited on the insulating substrate by combustion chemical vapor deposition (CCVD). In the case of zero valence metals and dielectric material, the homogeneous mixture is achieved by co-deposition of the metal and dielectric material by CCVD. To form discrete patches of the resistive material, substantially any metal-based resistor material, including those based on the noble metals, can be etched away by aqua regia. Thus, a layer of resistive material may be covered with a patterned resist, e.g., an exposed and developed photoresist, and exposed portions of the underlying layer of resistive material etched away. Furthermore, the invention provides for the formation of thin layer resistors including the insulating substrate, discrete patches of a layer of resistive material, and conductive material in electrical contact with spaced-apart locations on the patches of resistive material layer, such conductive material providing for electrical connection of the resistive material patches with electronic circuitry. Such structures of insulating material, resistive material, and conductive material may be formed by selective etching procedures.

DETAILED DESCRIPTION OF THE PREFERRED EMBODIMENTS

The present invention may be understood more readily by reference to the following detailed description of preferred embodiments of the invention and the Figures.

It is to be understood that the terminology used herein is for the purpose of describing particular embodiments only and is not intended to be limiting. It must be noted that, as used in the specification and the appended claims, the singular forms "a," "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

The present invention provides a method for coating a substrate with a selected material. The method comprises, at a first selected temperature and a first selected pressure, dissolving into a suitable carrier to thereby form a transport solution one or more reagents capable of reacting (where, for a single precursor reagent, the precipitation of the reagent from the solution or change in chemical bonds is herein considered a "reaction") to form the selected material. At some time prior to the actual deposition, a substrate is positioned in a region having a second selected pressure. The second selected pressure can be ambient pressure and is generally above 20 torr. The transport solution is then pressurized to a third selected pressure above the second selected pressure using a pressure regulating means. One of skill in the art would recognize that there are many suitable pressure regulating means, including, but not limited to compressors, etc. Next, the pressurized, transport solution is directed to a fluid conduit having an input end and an opposed output end having a temperature regulating means positioned thereon for regulating the temperature of the solution at the output end. The output end of the conduit further comprises an outlet port oriented to direct the fluid in the conduit into the region and in the direction of the substrate. The outlet port can be of a shape similar to a nozzle or restrictor as used in other spraying and atomizing applications. Thereafter, the solution is heated using the temperature regulating means to a second selected temperature within 50° C. above or below the critical temperature, $T_c$, of the solution while maintaining the third selected pressure above the second selected pressure and above the corresponding liquidus or critical pressure, $P_c$, of the solution at the second selected temperature using the pressure regulating means. Then, the pressurized, heated solution is directed through the outlet port of the conduit into the region to produce a nebulized solution spray in the direction of the substrate. As the solution is directed into the region, one or more selected gases are admixed into the nebulized solution spray to form a reactable spray and, thereafter, this reactable spray is exposed to an energy source at a selected energization point. The energy source provides sufficient energy to react the reactable spray (which contains the one or more reagents of the transport solutions) thereby forming the material and coating the substrate therewith.

In a further embodiment of this method, the energy source comprises a flame source and the selected energization point comprises an ignition point. In an alternate embodiment, The energy source comprises a plasma torch.

In a further embodiment of the method, the second selected pressure of the region is ambient pressure.

In yet another embodiment, the nebulized solution spray is a vapor or an aerosol having a maximum droplet size of less than 2 $\mu$m.

In a further embodiment, the second selected pressure of the region is reduced to produce a combustion flame having a temperature of less than 1000° C.

In yet another embodiment, the carrier is propane and the transport solution comprises at least 50% by volume propane. In a further embodiment, the transport solution further includes butanol, methanol, isopropanol, toluene, or a combination thereof. In yet another embodiment, the carrier is selected such that the transport solution is substantially precipitate free at standard temperature and pressure for a period of time sufficient to carry out the method.

In an alternate embodiment of the method, a pressurized container is used and before, during or after the pressuring step, a standard temperature and pressure gas is also contacted with the transport solution at a selected pressure sufficient to form a liquid or supercritical fluid (depending upon the temperature). In a preferred embodiment, the transport solution containing the standard temperature and pressure gas is substantially precipitate free at the selected pressure for a period of time sufficient to carry out the method. In yet another embodiment, the reagent concentration of the transport solution is between 0.0005 M and 0.05 M.

In a further embodiment, the outlet end of the conduit further comprises a fluid introduction port and, prior to directing the pressurized, heated solution through the outlet port of the conduit, fluid is added to the pressurized, heated solution through the fluid introduction port. Such introduction forms a combined solution having a reduced supercritical temperature.

In yet another embodiment, each of the one or more reagents has a vapor pressure of no less than about 25% of the vapor pressure of the carrier.

In a further embodiment, the outlet end of the conduit comprises tubing having an internal diameter of 2 to 1000 $\mu$m, more preferably 10 to 250 $\mu$m. In a more preferable embodiment, the outlet end of the conduit comprises tubing having an internal diameter of 25 to 125 $\mu$m. In yet a further preferable embodiment, the outlet end of the conduit comprises tubing having an internal diameter of 50 to 100 $\mu$m.

In another embodiment, the temperature regulating means comprises means for resistively heating the conduit by applying thereto an electric current of a selected voltage from an electric current source. In a preferred embodiment, the voltage is less than 115 Volts. In yet another preferred embodiment, the means for resistively heating the conduit comprises a contact positioned within 4 mm of the outlet port.

Moreover, the present invention also provides the above method wherein the carrier and one or more reagents are selected such that the second selected temperature is ambient temperature.

The above method may be practiced wherein the material that coats the substrate comprises a metal, a metal or metalloid oxide, or a mixture of a metal with a metal or metalloid oxide.

In a further embodiment, the reactable spray comprises a combustible spray having a combustible spray velocity and wherein the combustible spray velocity is greater than the flame speed of the flame source at the ignition point and further comprising one or more ignition assistance means for igniting the combustible spray. In a preferred embodiment, each of the one or more ignition assistance means comprises a pilot light. In yet another embodiment, the combustible spray velocity is greater than mach one.

In a further embodiment, the ignition point or flame front is maintained within 2 cm. of the outlet port.

The present invention also provides a method where, during the exposing step, cooling the substrate using a substrate cooling means. In a preferred embodiment, the substrate cooling means comprises a means for directing water onto the substrate. However, one of ordinary skill in the art would recognize that many other suitable cooling means could be used.

In a further embodiment, the material that coats the substrate has a thickness of less than 100 nm. In yet another embodiment, the material that coats the substrate comprises a graded composition. In another embodiment, the material that coats the substrate comprises an amorphous material. In a further embodiment, the material that coats the substrate comprises a nitride, carbide, boride, metal or other non-oxygen containing material.

The present invention also provides a method further comprising flowing a selected sheath gas around the reactable spray thereby decreasing entrained impurities and maintaining a favorable deposition environment.

In a preferred embodiment, the second selected pressure is above 20 torr.

Referring now to FIG. 1, the preferred apparatus 100 comprises a pressure regulating means 110, such as a pump, for pressurizing to a first selected pressure a transport solution T (also called "precursor solution") in a transport solution reservoir 112, wherein the transport solution T comprises a suitable carrier having dissolved therein one or more reagents capable of reacting to form the selected material and wherein the means for pressurizing 110 is capable of maintaining the first selected pressure above the corresponding liquidus (if the temperature is below $T_c$) or critical pressure, $P_c$, of the transport solution T at the temperature of the transport solution T, a fluid conduit 120 having an input end 122 in fluid connection with the transport solution reservoir 112 and an opposed output end 124 having an outlet port 126 oriented to direct the fluid in the conduit 120 into a region 130 of a second selected pressure below the first selected pressure and in the direction of the substrate 140, wherein the outlet port 126 further comprises means 128 (see FIGS. 2 and 3, atomizer 4) for nebulizing a solution to form a nebulized solution spray N, a temperature regulating means 150 positioned in thermal connection with the output end 124 of the fluid conduit 120 for regulating the temperature of the solution at the output end 124 within 50° C. above or below the supercritical temperature, $T_c$, of the solution, a gas supply means 160 for admixing one or more gases (e.g., oxygen) (not shown) into the nebulized solution spray N to form a reactable spray, an energy source 170 at a selected energization point 172 for reacting the reactable spray whereby the energy source 170 provides sufficient energy to react the reactable spray in the region 130 of the second selected pressure thereby coating the substrate 140.

In a further embodiment of the apparatus, the energy source 170 comprises a flame source and the selected energization point 172 comprises an ignition point. In an alternate embodiment, the energy source 170 comprises a plasma torch. In yet another embodiment, the outlet port 126 further comprises a pressure restriction (see FIG. 3, restrictor 7).

In a further embodiment of the apparatus, the second selected pressure of the region is ambient pressure.

In yet another embodiment, the nebulized solution spray N is a vapor or an aerosol having a maximum droplet size of less than 2 $\mu$m.

In a further embodiment, the second selected pressure of the region is reduced to produce a combustion flame having a temperature of less than 1000° C.

In yet another embodiment, the carrier is propane and the transport solution comprises at least 50% by volume propane. In a further embodiment, the transport solution further includes butanol, methanol, isopropanol, toluene, or a combination thereof. In yet another embodiment, the carrier is selected such that the transport solution is substantially precipitate free at standard temperature and pressure for a period of time sufficient to carry out the method.

In an alternate embodiment of the apparatus, a pressurized container (not shown) is provided and a standard temperature and pressure gas is also contacted with the transport solution at a selected pressure sufficient to form a liquid or supercritical fluid. In a preferred embodiment, the transport solution containing the standard temperature and pressure gas is substantially precipitate free at the selected pressure for a period of time sufficient to carry out the method. In yet another embodiment, the reagent concentration of the transport solution is between 0.0005 M and 0.05 M.

In a further embodiment, the outlet end 124 of the conduit 120 further comprises a fluid introduction port (see FIG. 2, feed lines 17 or 19) and, prior to directing the pressurized, heated solution through the outlet port 126 of the conduit 120, fluid is added to the pressurized, heated solution through the fluid introduction port. Such introduction forms a combined solution having a reduced supercritical temperature.

In yet another embodiment, each of the one or more reagents has a vapor pressure of no less than about 25% of the vapor pressure of the carrier.

In a further embodiment, the outlet end of the conduit comprises tubing having an internal diameter of 2 to 1000 $\mu$m, more preferably 10 to 250 $\mu$m. In a more preferable embodiment, the outlet end of the conduit comprises tubing having an internal diameter of 25 to 125 $\mu$m. In yet a further preferable embodiment, the outlet end of the conduit comprises tubing having an internal diameter of 50 to 100 $\mu$m.

In another embodiment, the temperature regulating means 150 comprises means for resistively heating the conduit by applying thereto an electric current of a selected voltage from an electric current source. In a preferred embodiment, the voltage is less than 115 Volts. In yet another preferred embodiment, the means for resistively heating the conduit comprises a contact 152 positioned within 4 mm of the outlet port 126.

Moreover, it is provided that the above apparatus is utilized wherein the carrier and one or more reagents are selected such that the second selected temperature is ambient temperature.

The above apparatus may be used wherein the material that coats the substrate 140 comprises a metal. Alternatively, the material that coats the substrate 140 comprises one or more metal oxides. In yet a further embodiment, the material that coats the substrate 140 comprises at least 90% silica.

In a further embodiment, the reactable spray comprises a combustible spray having a combustible spray velocity and wherein the combustible spray velocity is greater than the flame speed of the flame source at the ignition point 172 and further comprising one or more ignition assistance means 180 for igniting the combustible spray. In a preferred embodiment, each of the one or more ignition assistance means 180 comprises a pilot light. In yet another embodiment, the combustible spray velocity is greater than mach one.

In a further embodiment, the ignition point 172 or flame front is maintained within 2 cm. of the outlet port.

The present invention also provides a substrate cooling means 190 for cooling the substrate 140. In a preferred embodiment, the substrate cooling means 190 comprises a means for directing water onto the substrate 140. However, one of ordinary skill in the art would recognize that many other suitable cooling means could be used.

In a further embodiment, the material that coats the substrate 140 has a thickness of less than 100 nm. In yet another embodiment, the material that coats the substrate 140 comprises a graded composition.

There is further an apparatus provided comprising a means (see FIGS. 2 and 3, feed line 17 or 19) for flowing a selected sheath gas around the reactable spray thereby decreasing entrained impurities and maintaining a favorable deposition environment.

In a preferred embodiment, the second selected pressure is above 20 torr.

In a further embodiment of the method, the energy source comprises a flame source and the selected energization point comprises an ignition point. In an alternate embodiment, the energy source comprises a plasma torch, hot gasses, etc.

In a further preferred embodiment of the powder forming method, the transport solution concentration is between 0.005 M and 5 M.

To simplify the operation, it is helpful to pump the precursor/solvent solution to the atomizing device at room temperature. Heating of the solution should occur as a final step just prior to release of the solution into the lower pressure region. Such late stage heating minimizes reactions and immiscibilities which occur at higher temperatures. Keeping the solution below the supercritical temperature until atomization maintains the dissolved amounts of precursor in the region of normal solubility and reduces the potential of developing significant solvent-precursor concentration gradients in the solution. These solubility gradients are a result of the sensitivity of the solution strength of a supercritical solvent with pressure. Small pressure gradients (as they can develop along the precursor-solvent system delivery) can lead to significant changes in solubility as has been observed. For instance, the solubility of acridine in carbon dioxide at 308° K can be increased 1000 times by increasing the pressure from 75 atm to 85 atm. See V. Krukonis, "Supercritical Fluid Nucleation of Difficult to Comminute Solids", Presented at AIChE Meeting, San Francisco, Nov. 25–30, 1984. Such solubility changes are potentially detrimental because they may cause the precursor to be driven out of solution and precipitate or react prematurely, clogging lines and filters.

The rapid drop in pressure and the high velocity at the nozzle cause the solution to expand and atomize. For solute concentrations in the normal solubility range, preferred for operation of the near supercritical atomization system of the present invention, the precursors are effectively still in solution after being injected into the low pressure region. The term "effectively in solution" must be understood in conjunction with processes taking place when a solution with solute concentrations above the normal solvent strength is injected into the low pressure region. In this case, the sudden pressure drop causes high supersaturation ratios responsible for catastrophic solute nucleation conditions. If the catastrophic nucleation rapidly depletes the solvent from all dissolved precursor, the proliferation of small precursor particles is enhanced. See D. W. Matson, J. L. Fulton, R. C. Petersen and R. D. Smith, "Rapid Expansion of Supercritical Fluid Solutions: Solute Formation of Powders, Thin Films, and Fibers", Ind. Eng. Chem. Res., 26, 2298 (1987); H. Anderson, T. T. Kodas and D. M. Smith, "Vapor Phase Processing of Powders: Plasma Synthesis and Aerosol Decomposition", Am. Ceram. Soc. Bull., 68, 996 (1989); C.

J Chang and A. D Randolph, "Precipitation of Microsize Organic Particles from Supercritical Fluids", AIChE Journal, 35, 1876 (1989); T. T. Kodas, "Generation of Complex Metal Oxides by aerosol Processes: Superconducting Ceramic Particles and Films", Adv. Mater., 6, 180 (1989); E. Matijevic, "Fine Particles: Science ad Technology", MRS Bulletin, 14, 18 (1989); E. Matijevic, "Fine Particles Part II: Formation Mechanisms and Applications", MRS Bulletin, 15, 16 (1990); R. S. Mohamed, D. S. Haverson, P. G. Debenedetti and R. K. Prud'homme, "Solid Formation After Expansion of Supercritical Mixtures," in Supercritical Fluid Science and Technology, edited by K. P. Johnston and J. M. L. Penniger, p.355, American Chemical Society, Washington, D.C. (1989); R. S. Mohamed, P. G. Debenedetti and R. K. Prud'homme, "Effects of Process Conditions on Crystals Obtained from Supercritical Mixtures", AIChE J., 35, 325 (1989); J. W. Tom and P. G. Debenedetti, "Formation of Bioerodible Polymeric Microspheres and Microparticles by Rapid Expansion of Supercritical Solutions", Biotechnol. Prog., 7, 403 (1991). Particles are undesirable for the formation of thin coatings, but can be beneficial during the formation of powders.

Thus the heated atomizer provides the further superior advantages, compared to an unheated device that operates on rapid expansion of a solvent at exclusively above the supercritical temperature, that (1) the temperature allows for a well controlled degree of atomization of the precursor-solvent mixture and (2) catastrophic nucleation of the precursors can be omitted while still enjoying the benefits of supercritical atomization. Supersonic velocities can be created forming a mach disk which additionally benefits atomization. Addition of gasses to the released atomized materials aids in directing the flow and can ensure a desired mixture for combustion.

By adjusting the heat input into the atomizing device, the liquid solution can be vaporized to various degrees. With no heat input to the atomizing device, liquid solutions of higher supercritical temperature liquids, that are liquids at STP, can exit in the form of a liquid stream which is clearly far from a supercritical condition. This results in a poorly formed flame and, possibly, undesirable liquid contact with the substrate. Decreasing the temperature differential of the liquid solution to its supercritical temperature at the nozzle causes the liquid solution to break up into droplets forming a mist which is released from the atomizing device. The droplets vaporize, and thus become invisible, after a short distance. As the supercritical temperature at the atomizing device is approached, the liquid solution droplets decrease in size, and the distance to solution vaporization is decreased. Using this atomizer the vapor droplet size was determined using an aerosol vaporization tester and the obtained droplet size was below the 1.8 µm detection limit of the instrument.

Further increasing the heat input results in a state of no mist at the tip, or complete vaporization. Without wishing to be bound by theory, this behavior of the solution can be attributed to the combined supercritical properties of the reagents and solvents. Solutions of precursors in lower supercritical temperature solvents, that are gasses at STP, behave similarly, but the emerging solution from the tip (also referred to as the "nozzle" or "restrictor") does not form a liquid stream, even without heat input. The amount of heat needed to obtain optimal vaporization of the solution depends mostly on the heat capacity of the solution and the differential between the supercritical temperature of the solvent and the ambient temperature around the nozzle.

It is desirable to maintain the pressure and temperature of the system (before vaporization) above the boiling and the supercritical point of the solution. If the pressure falls below the liquidus or critical pressure, coincident with the temperature above the boiling point, vaporization of the solvents will occur in the tube prior to the tip. This leaves the solutes which can build up and clog the atomizing device. Similarly the pressure is preferably sufficiently high in the supercritical region so that the fluid is more liquid-like. Liquid-like supercritical fluids are better solvents than more gas-like supercritical fluids, further reducing the probability of solutes clogging the atomizing device. If the precursor-to-precursor interaction is higher than the strength between solvent and precursor, the solvent-precursor bonds can be broken and effectively drive the precursor out of solution. Precursor molecules then form clusters that adhere to the atomizing device and clog the restrictor. The problem can be solved, in most cases, by shifting the vaporization point from the inside of the tip to the end of the tip, which is accomplished by reducing the heat input into the atomizing device. Another solution is to A use a solvent which forms stronger bonds with the precursor so a more stable solution is formed. A small amount of mist at the tip usually results in the best quality thin films. Nano- or micro-spheres of the material will form if the temperature of the solution it too high or too low. These spheres are detrimental if dense coatings are desired.

If the no-mist condition is reached, the deposition is being performed above the critical temperature. The heat of the flame and mixing with external gasses keeps STP liquid solvents from condensing and forming droplets. In the no-mist instance, atomization and intermixing is very good but flow stability is reduced, resulting in a flame that can jump from side to side with respect to the direction of the tip. With such a flame behavior, depositions remain possible, but it can be difficult to deposit films requiring stringent thickness uniformity. Additionally, it is necessary to maintain the temperature of the solution, prior to release, below the temperature where either the solute precipitates or reacts and precipitates. When using a solvent mixture it may be possible during heating to cross the line for spinoidal immiscibility. This causes the formation of two separate phases, with the possibility of concentration differences in the two phases due to different solubilities of the solutes. This may influence the formation of precursor and product spheres at high atomization temperatures. All of these factors demonstrate the preferability of minimizing the solution's exposure to heating, if necessary, until the tip so that possible unwanted equilibrium condition states of matter do not have sufficient time to transpire. The structure of the films deposited can thus be precisely controlled.

Due to this control, a number of film microstructures are possible. By increasing solution concentration it is possible to increase the deposition rate and the following microstructural changes result with increasing solution concentration; dense to porous, specular to dull, smooth to rough, columnar to hillocks, and thin to thick. Graded and multilayered coatings can also be produced. Multilayers can be formed by supplying different precursor containing solutions to an individual flame. Sequential multiple deposition flames may be used to increase throughput for production applications. Some additional factors controlling deposition parameters include; substrate surface temperature which controls surface diffusion and nucleation; pressure which controls boundary layer thickness and thus deposition rate, solution composition and mix gasses varies the material being deposited and thus the coatings growth habit, flame and plasma energy level effects where the reaction occurs and vapor stability, and the distance to the substrate effects the time from nebulization to reaction to deposition which can lead to particle formation or increased diffusion time for larger clusters. Additionally, electric and magnetic fields affect the growth habits of some materials, or increase deposition efficiency. One of ordinary skill in the art would recognize that such electric and magnetic fields will affect the growth habits of some vapor deposited materials, as well as vary the particular deposition rate and efficiency.

Because the required energy input into the solution heating atomizer varies for different precursor/primary-solvent/secondary-solvent solutions, it is preferred to deposit multilayer thin films from solutions with constant primary to secondary solvent ratios. In so doing, it is not necessary to change the energy input to the atomizer when switching from one solution to another solution. The resulting simplification of the setup produces increased performance and reliability while reducing costs. Alternatively, the substrate can be passed by flames containing different reagents to build the desired multilayer.

When the solution provides the fuel for combustion, concentrations up to 0.1 molar result in dense coatings depending on the material. Most materials have preferred concentrations of up to 0.01 molar. Materials with lower diffusion and mobility need solution concentrations of less than 0.002. Solution concentrations of less than 0.0001 molar result in very slow deposition rates for most materials. Flame depositions with added combustible materials can have higher concentrations, even exceeding 1 M, but for the preferable vapor formation of the precursors, high concentrations are less desirable unless the precursor(s) have high vapor pressures. Low vapor pressure precursor solution concentrations are preferably less than 0.002 molar.

Without wishing to be bound by theory, it is helpful to understand that the principle of the deposition technique of the present invention involves the finding that CVD its not limited to reactions at the surface. See Hunt, A. T., "Combustion Chemical Vapor Deposition, a Novel Thin Film Deposition Technique", Ph.D. Thesis Georgia Inst. of Tech, Atlanta, Ga., (1993); Hunt, A. T., "Presubstrate Reaction CVD, and a Definition for Vapor", presented at the 13th Int. Conf. on CVD, Los Angles, Calif. (1996), the contents of which are hereby incorporated by this reference. Reactions can occur predominately in the gas stream, but the resulting material which is deposited must be subcritical in size to yield a coating with vapor deposited microstructures. These observations demonstrate that a vapor is composed of individual atoms, molecules or nanoclusters which can be absorbed onto a substrate and readily diffused into lower energy sites or configurations. Thus the maximum cluster size must decrease with lower substrate temperatures as does the critical nucleus size. It is known by one of ordinary skill in the art that reagent clusters are left after vaporization of the solvents, and the cluster size is related to the reagent vapor pressure, initial droplet size and the solution concentration. Therefore, atomization of low vapor pressure reagents, which therefore do not gasify in the flame, must be very fine to form vapor.

Preferred liquid solvents are low cost solvents include, but are not limited to, ethanol, methanol, water, isopropanol and toluene. Water solutions must be fed into a preexisting flame, while the combustible solvents can themselves be used to form the flame. It is preferable, but not required, to form the bulk of the flame using the solution rather than feeding the solution into a flame. Lower reagent concentration results this way, which eases the formation of subcritical nucleus sized materials.

One preferred solvent and secondary solution fluid which is propane, which is a gas at STP. However, it must be noted that many other solvent systems are operable. See, e.g., *CRC Handbook of Chemistry and Physics*, CRC Press, Boca Raton, Fla. Propane is preferred because of its low cost, its commercial availability, and its safety. Many low cost organometalics can be used in a predominately propane solution. To ease handling, the initial precursors can be dissolved in methanol, isopropanol, toluene or other solvents compatible with propane. This initial solution is then placed into a container into which liquid propane is added. Propane is a liquid at above only about 100 psi at room temperatures. The resulting solution has a much lower supercritical point than the initial solution which eases atomization by lowering the required energy input into the atomizer. Additionally, the primary solvent acts to increase the polar solubility of the propane, thus allowing higher solution concentrations for many reagents than would otherwise be achieved by propane alone. As a general rule, the polarity of the primary solvent should increase with increasing polarity of the solute (precursor). Isopropanol can thus aid in the solubility of a polar solute better than toluene. In some cases the primary solvent acts as a shield between the secondary solvent and a ligand on the solute. One example is the dissolution of platinum-acetylacetonate $[Pt(CH_3COCHCOCH_3)_2]$ in propane, where the weight ratios between precursor/primary solvent and primary solvent/secondary solvent can be higher than those required in other systems.

Ammonia has been considered and tested as a secondary solvent for the deposition of coatings and powders. While ammonia is an inexpensive solvent that is compatible with some nitrate based precursors, it is not easily usable with other secondary solvents and problems stem from the general aggressiveness of pure ammonia. The atomization properties of ammonia were tested without the addition of a precursor and the used pressure vessel was significantly attacked after the experiment even when an inert Type-316 stainless steel vessel was used. In contrast to hydrocarbon based solvents, ammonia also renders Buna-N and Viton gaskets useless after only a few minutes. Even with a suitable gasket material this is a problem since the desired coatings or powders usually must not contain traces of iron or other elements leached from the pressure vessel wall. However, there are materials, such as EPDM elastomer which may be used.

Other gas-like secondary solvents that were tested and can be used include ethane, ethylene, ethane/ethylene mixture, propane/ethylene mixture, and propane/ethane mixture. Platinum thin films were deposited from a supercritical mixture of ethane and a platinum metalorganic.

Other tested solvents and solvent mixtures resulted in similar quality, but were more complex to work with since their boiling points are significantly lower, which required cooling of the solution or very high pressures. The ease of handling makes propane the preferred solvent but the other supercritical solvents are considered alternatives to propane in cases where propane cannot be used, such as when a precursor that is soluble in propane cannot be found. Other fluids can be used to further reduce the supercritical temperature if desired.

One heating method is the application of an electric current between the nozzle end, where the precursor solution is injected into the low pressure region, and the back of the restriction tube. This directly heated restrictive tube method allows for fast changes in atomization due to a short response time. The location of most intense heating can be shifted toward the tip by increasing the connection resistance between the tip and the electrical lead connected to the tip. Thin walled restriction tubes possess a larger resistance than thick walled tubes and decrease the response time. Other heating methods can be applied and several have been investigated, including but not limited to, remote resistive heating, pilot flame heating, inductive heating and laser heating. One of ordinary skill in the art could readily determine other suitable heating means for regulating the temperature at the outlet port of the atomizer.

Remote resistive heating uses a non-conducting restriction tube that is located inside an electrically heated tube. The non-conducting tube will fit tightly into the conductive tube. Application of an electric current to the conductive type heats that tube and energy is transferred into the inner, non-conductive restriction tube. This method requires larger heating currents compared to the directly-heated restrictive tube method and shows longer response times, which can be advantageous under certain conditions since the increased response time results in a high degree of thermal stability. On the other hand, pilot flame and laser heating use the energy of the pilot flame or laser light, respectively, to heat the restriction tube. This can be done in a directly heated setup where the tip of the restriction tube is subjected to the pilot flame or laser light or in an indirectly heated configuration where the larger outer tube is heated. Because the amount of energy that needs to be transferred into the solution is quite large, the heated tube will, preferably, have a thicker wall than in the case of direct electrical heating or remote electrical heating. Subjecting an outer tube to the pilot flame or laser light allows the use of a thin walled restriction tube.

Figure 2:
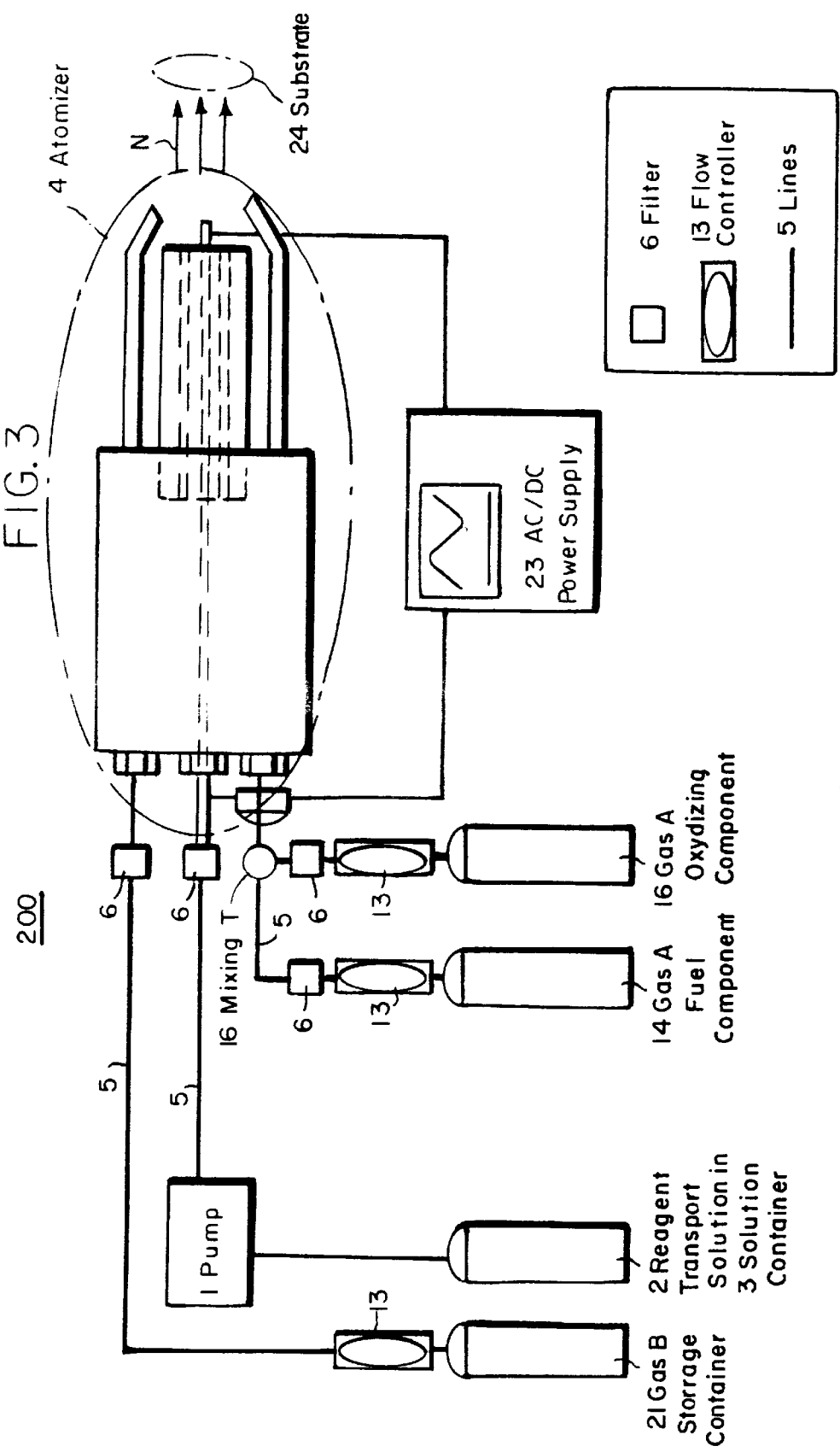
FIG. 2 shows a schematic diagram of an apparatus for the deposition of films and powders using near supercritical and supercritical atomization.
Figure 3:
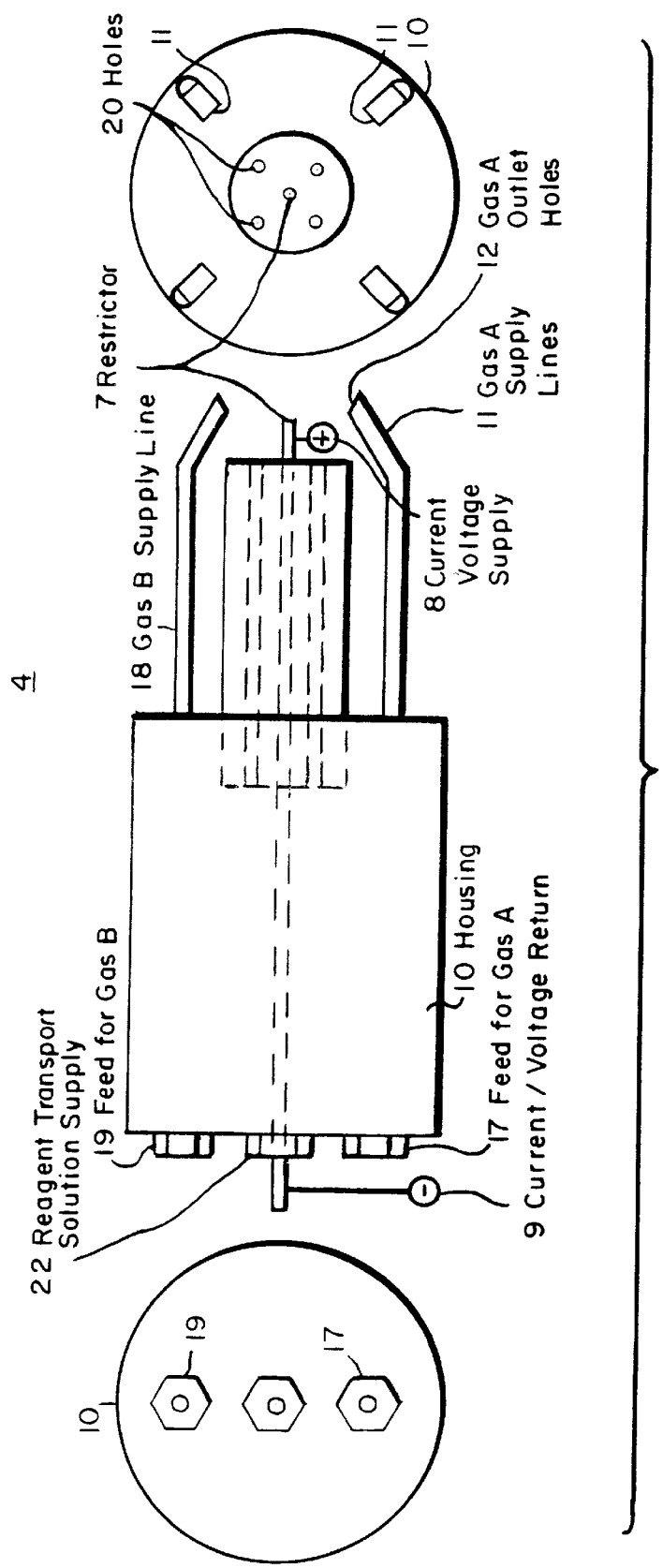
FIG. 3 shows a detailed schematic view of the atomizer used in the present invention.

Referring now to FIGS. 2 and 3, an apparatus 200 for the deposition of films and powders using supercritical atomization is shown. The apparatus 200 consists of a fixed or variable speed pump 1 that pumps the reagent transport solution 2 (also called "precursor solution") from the solution container 3 into the atomizer (also referred to as the "nebulizer" or "vaporizer") 4. FIG. 3 is an inset view showing a more detailed schematic view of the atomizer 4. The precursor solution 2 is pumped from the precursor solution container 3 through lines 5 and filters 6 and into the atomizer 4. The precursor solution 2 is then pumped into a constant or variable temperature controlled restrictor 7. Heating can be accomplished in many ways including, but not limited to, resistive electrical heating, laser heating, inductive heating, or flame heating. For resistive electrical heating, either AC or DC current can be used. One of the electrical connections 8 to the restrictor 7 is preferably placed very close to the tip of the restrictor 7. In the case of heating by a DC source, this connection 8 or pole can be either positive or negative. The other pole 9 can be connected at any other point along the restrictor 7, inside or outside the housing 10. For special applications such as coating the inside of tubes, where a small total atomizer size is advantageous, it is preferable to either connect to the restrictor 7 at the back of the housing 10 or to connect inside the housing 10. Gas connections at the back of the housing 10 are shown in an on-line arrangement but can be placed in any other arrangement that does not interfere with the function of the apparatus 200.

The thin gas A supply line 11, 1/16" ID in most cases, carries a combustible gas mix to a small outlet 12 where it can serve as a stable pilot flame, preferably within 2.5 cm of the restrictor 7, for the combustion of the precursor solutions supplied via the restrictor 7. Gas A supply is monitored by a flow controller 13, controlling the flow of the individual gas A mix components, 14 and 15. The gas A fuel component 14 is mixed with the oxidizing component 15 in a mixing "T" 16 close to or inside the atomizer 4. This late mixing is preferably for safety reasons because it reduces potential flash-back. Distribution channels inside the housing 10 connect the gas supply lines 11 to the gas A feed 17. Gas B supply lines 18 are used to deliver gas B from the supply 19 such that good mixing with the nebulized solutions spray can be accomplished. In most cases a high velocity gas stream is utilized. A number of gas B supply holes 20 (six for most cases, more or less holes can be used depending on the particular application) is placed around the restrictor 7 supplying gas B such that the desired flow pattern is obtained. The flow properties of the gas B stream are influenced by such factors as gas B pressure in the gas B storage container 21, flow rate as determined by the flow controller 13, line diameters 5, and number of supply holes 20. Alternatively, gas B can be fed through a larger tube coaxial to and surrounding the restrictor 7. Once the precursor solution 2 has been pumped into the precursor supply 22 its temperature is controlled by the current flow (in the case of electrical heating) through the restrictor 7 as determined by the power supply 23. This heating current can then be adjusted such that the proper amount of atomization (nebulization, vaporization) can occur. The stable pilot flame is then capable of igniting the nebulized reactive spray and depositing a powder or film on a substrate 24.

Many different coatings have been deposited using the methods and apparatuses described herein. While propane was used in most cases as the super critical secondary solvent (i.e. a small amount of high precursor concentration primary solvent was mixed with a large amount of secondary solvent), others solvents have been used. Other possible secondary solvents include, but are not limited to $N_2O$, ethylene, ethane, and ammonia.

One of ordinary skill in the art would recognize that almost any substrate can be coated by the method and apparatus of the present invention. A substrate can be coated if it can withstand the temperature and conditions of the resulting hot gases produced during the process. Substrates can be cooled using a means for cooling (described elsewhere herein), such as a water jet, but at low substrate surface temperatures, dense or crystalline coatings of many materials are not possible because of the associated low diffusion rates. In addition, substrate stability in the hot gases can be further accounted for by using a low temperature, low pressure flame, either with or without additional substrate cooling.

A variety of chemical precursors have been suggested for CCVD deposition of films and powders, and additional chemical precursors are suggested herein. In addition to providing the metal or metalloid element, it is required of any chemical precursor for CCVD that it be soluble in a suitable carrier solvent, most desirably soluble in propane. Furthermore, if the precursor solution is to contain precursors of more than one metal and/or metalloid, the chemical precursors must be mutually soluble in a suitable carrier solvent and chemically compatible with each other. If a precursor is not highly soluble in a primary solvent, such as propane, it may be initially dissolved in a secondary solvent, such as toluene, and subsequently introduced into the primary solvent as a solution in the secondary solvent, providing that the chemical precursor does not precipitate when such a solution is introduced into the primary solvent. Furthermore, cost considerations enter into the choice of chemical precursor.

If a mixture of chemical precursors are to be provided for depositing a layer or powder of a particular composition, it is desirable that such precursors be combinable as a homogeneous "pre-solution" without the addition of any additional solvent. If not, it is desirable that all chemical precursors be mutually soluble in a common solvent, the less solvent the better, as a "pre-solution". These desired properties, of course, facilitate shipping and handling, particularly when the intended primary solvent is propane or another material which is gaseous at room temperature. Though desirable to be able to provide a "pre-solution", it is considered acceptable that the chemical precursors be mutually soluble in a deposition solution of one or more solvents and either be prepared and sold as such a solution or prepared on-site as a deposition solution.

For deposition, the total concentration of the precursor compounds in the carrier solvent is generally between about 0.001 and about 2.5 wt %, preferably between about 0.05 and about 1.0 wt %.

For most CCVD depositions, it is preferred that the precursors be dissolved in an organic solvent. However, for the electrically resistive materials to which the present invention is directed, it is undesirable that carbon co-deposits with the resistive material. Some materials, nickel, for example, have a high affinity for carbon. Accordingly, precursors for such materials may be preferably dissolved in an aqueous and/or ammonia solution, in which case, the aqueous and/or ammonia and/or $N_2O$ solution would be aspirated into a hydrogen/oxygen flame for CCVD.

One of the advantages of CCVD, as performed with preferred atomizing apparatus, relative to other deposition methods, is that the a precursor solution containing one or more dissolved chemical precursors is atomized as a near-super critical liquid or, in some cases, as a super critical fluid. Accordingly, the amount of precursor or precursors being burned and deposited on a substrate or deposited in powder form is independent of the relative vapor pressures of the individual chemical precursors and the carrier solvent or solvents. This is in contrast to conventional CVD processes where individual supply lines must be provided for each chemical precursor that is to be vaporized, generally within a carrier gas, for supply to a CVD furnace. Also, some conventional CVD precursors disproportionate, making it difficult to supply such a chemical precursor uniformly-another problem readily addressed by CCVD technology.

Figure 7:
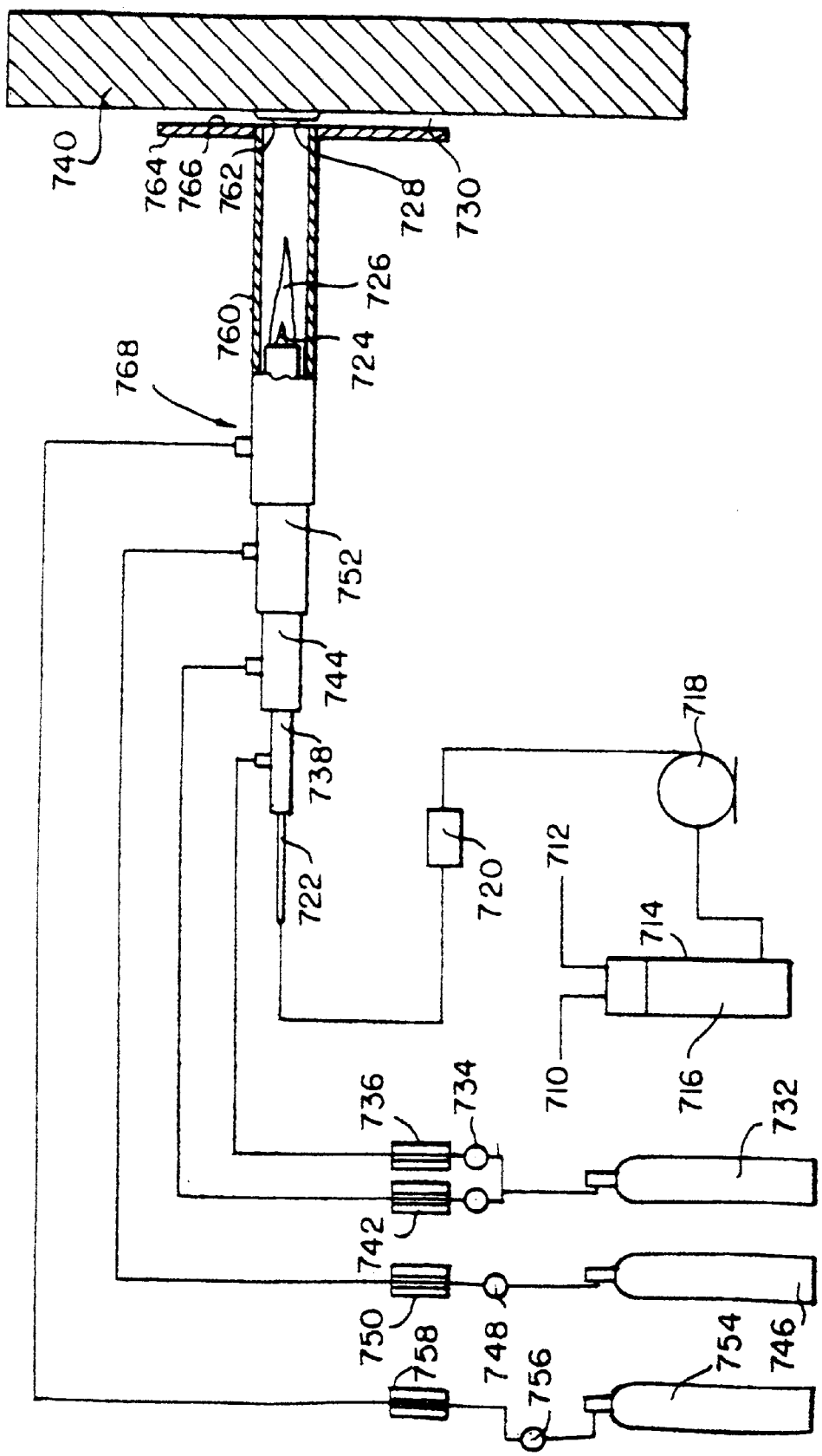
FIG. 7 is a schematic view, partially in section, of an apparatus for applying coatings in accord with the present invention.
Figure 8:
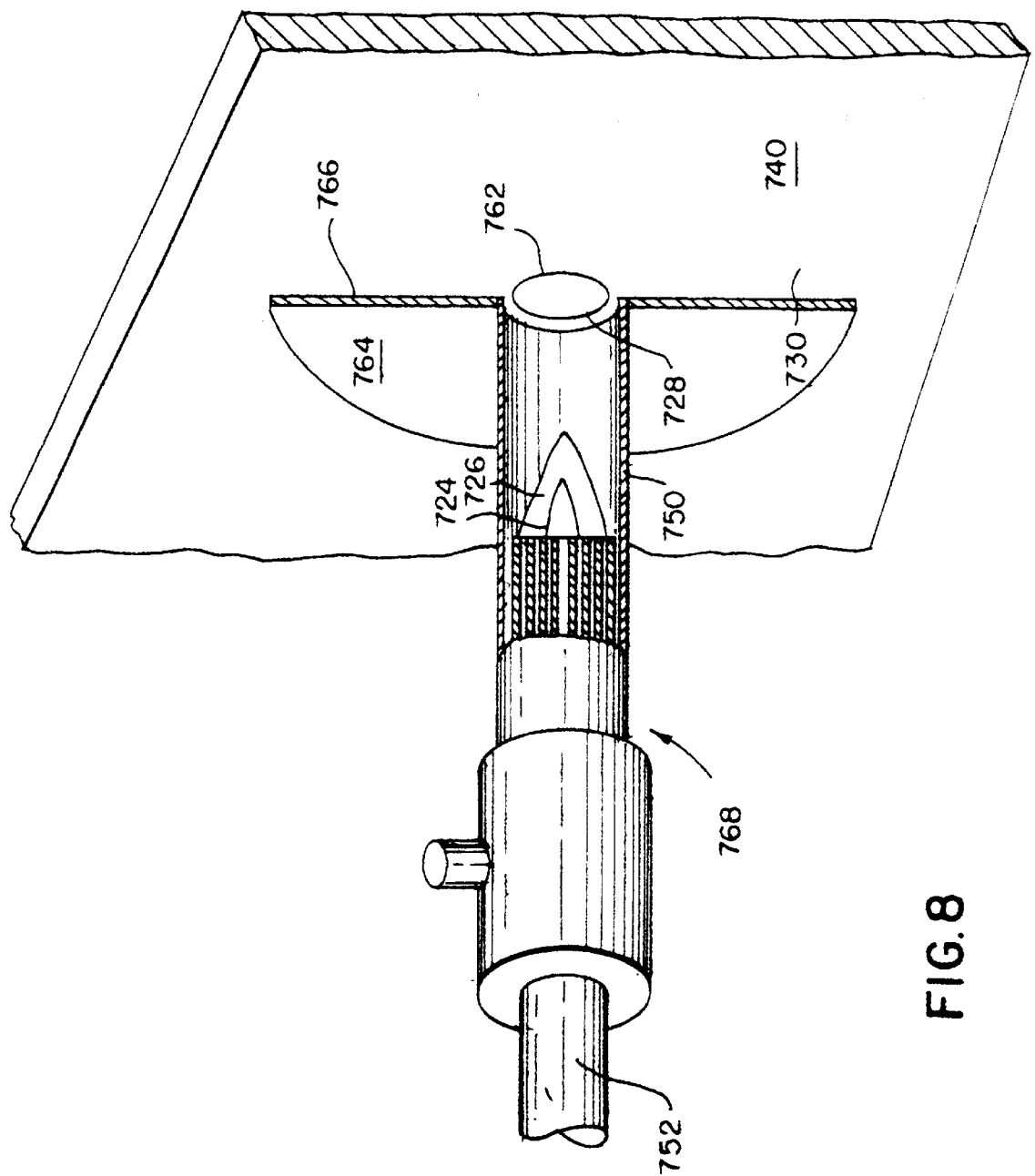
FIG. 8 is a close-up perspective view, partially in section, of a portion of the coating head used in the apparatus of FIG. 7.

A Controlled Atmosphere Combustion Chemical Vapor Deposition (CACCVD) apparatus is illustrated in FIGS. 7 and 8. A coating precursor 710 is mixed with a liquid media 712 in a forming zone 714, comprising a mixing or holding tank 716. The precursor 710 and liquid media 712 are formed into a flowing stream which is pressurized by pump 718, filtered by filter 720 and fed through conduit 722 to an atomization zone 724, from which it flows successively through reaction zone 726, deposition zone 728 and barrier zone 730. It is not required that a true solution be formed from mixing the coating precursor 710 with the liquid media 712, provided the coating precursor is sufficiently finely divided in the liquid media. However, the formation of a solution is preferred, since, generally, such produces a more homogeneous coating.

The flowing stream is atomized as it passes into the atomization zone 724. Atomization can be accomplished by recognized techniques for atomizing a flowing liquid stream. In the illustrated apparatus, atomization is effected by discharging a high velocity atomizing gas stream surrounding and directly adjacent the flowing stream as it discharges from conduit 722. The atomizing gas stream is provided from a gas cylinder or other source of high pressure gas. In the illustrated embodiment, high pressure hydrogen ($H_2$) is used both as an atomizing gas and as a fuel. The atomizing gas is fed from hydrogen gas cylinder 732, through regulating valve 734, flowmeter 736 and into conduit 738. Conduit 738 extends concentrically with conduit 722 to the atomization zone where both conduits end allowing the high-velocity hydrogen atomizing gas to contact the flowing liquid stream thereby causing it to atomize into a stream of fine particles suspended in the surrounding gas/vapors. This stream flows into the reaction zone 726 wherein the liquid media vaporizes and the coating precursor reacts to form a reacted coating precursor, which often involves dissociation of the coating precursor into ions of its components and results in a flowing stream of ionic particles, or plasma. The flowing stream/plasma, passes to the deposition zone 728 wherein the reacted coating precursor contacts the substrate 740 depositing the coating thereon.

The flowing stream may be atomized by injecting the atomizing gas stream directly at the stream of liquid media/coating precursor as it exits conduit 722. Alternatively, atomization can be accomplished by directing ultrasonic or similar energy at the liquid stream as it exits conduit 722.

The vaporization of the liquid media and reaction of the coating precursor require substantial energy input to the flowing stream before it leaves the reaction zone. This energy input can occur as it passes through the conduit 722, or in the atomization and/or reaction zones. The energy input can be accomplished by a variety of known heating techniques, such as electrical resistance heating, microwave or RF heating, electrical induction heating, radiant heating, mixing the flowing stream with a remotely heated liquid or gas, photonic heating such as with a laser, etc. In the illustrated preferred embodiment, the energy input is accomplished by the combustion of a fuel and an oxidizer in direct contact with the flowing stream as it passes through the reaction zone. This relatively new technique, referred to as Combustion Chemical Vapor Deposition (CCVD), is more fully described in the incorporated U.S. Pat. No. 5,652,021. In the illustrated embodiment, the fuel, hydrogen, is fed from hydrogen gas cylinder 732, through a regulating valve, flowmeter 742 and into conduit 744. The oxidizer, oxygen, is fed from oxygen gas cylinder 746, through regulating valve 748 and flowmeter 750 to conduit 752. Conduit 752 extends about and concentric with conduit 744, which extends with and concentrically about conduits 722 and 738. Upon exiting their respective conduits, the hydrogen and oxygen combust creating combustion products which mix with the atomized liquid media and coating precursor in the reaction zone 726, thereby heating and causing vaporization of the liquid media and reaction of the coating precursor.

A curtain of a flowing inert gas provided around at least the initial portion of the reaction zone isolates the reactive gases from the materials present in the apparatus located in proximity to the reaction zone. An inert gas, such as argon, is fed from inert gas cylinder 754, through regulating valve 756 and flowmeter 758 to conduit 760. Conduit 760 extends about and concentric with conduit 752. Conduit 760 extends beyond the end of the other conduits 722, 738, 744 and 752, extending close to the substrate whereby it functions with the substrate 740 to define a deposition zone 728 where coating 762 is deposited on the substrate generally in the shape of the cross-section of conduit 760. As the inert gas flows past the end of oxygen conduit 752, it initially forms a flowing curtain which extends about the reaction zone, shielding the reactive components therein from conduit 760. As it progresses down the conduit 760, the inert gas mixes with the gases/plasma from the reaction zone and becomes part of the flowing stream directed to the deposition zone 728.

An ignition source is needed to initially ignite the hydrogen and oxygen. A separate manually manipulated lighting or ignition device is sufficient for many applications, however the use of such may require a temporary reduction in the flow of inert gas until a stable flame front is established. In some applications, the total flow of gas may be too great to establish an unassisted stable flame front. In such case, it is necessary to provide an ignition device capable of continuously or semi-continuously igniting the combustible gases as they enter the reaction zone. A pilot flame or a spark producing device are exemplary ignition sources which may be employed.

In the deposition zone 728, the reacted coating precursor deposits coating 762 on the substrate 740. The remainder of the flowing stream flows from the deposition zone through a barrier zone 730 to discharge into the surrounding, or ambient, atmosphere. The barrier zone 730 functions to prevent contamination of the deposition zone by components of the ambient atmosphere. The high velocity of the flowing stream as it passes through the barrier zone 730 is a characteristic feature of this zone. By requiring that the flowing stream achieve a velocity of at least fifty feet per minute as it passes through the barrier zone, the possibility of contamination of the deposition zone by components of the ambient atmosphere is substantially eliminated in most coating applications. By requiring that the flowing stream achieve a velocity of at least one hundred feet per minute the possibility of ambient atmosphere contamination of the deposition zone is essentially eliminated in those coating operations which are more highly contamination sensitive, such as the production of TiN or WC.

In the embodiment of FIG. 7, a collar 764 is attached to and extends perpendicularly outward from the end of conduit 760 adjacent deposition zone 728. The barrier zone 730 is defined between the collar 764 and the substrate 740. The collar is shaped to provide a conforming surface 766 deployed close to the surface of the substrate whereby a relatively small clearance is provided for the exhaust of gases passing from the deposition zone to the ambient atmosphere. The clearance established between the conforming surface 764 of the collar and the substrate is sufficiently small that the exhaust gases are required to achieve the velocity required in the barrier zone for at least a portion of their passage between the collar and the substrate. To this end, the conforming surface 764 of the collar 762 is shaped to lie essentially parallel to the surface of the substrate 740. When the surface of the substrate 740 is essentially planar, as it is in the illustrated embodiment, the conforming surface of the substrate is also substantially planar.

Edge effects, such as elevated temperatures and residual reactive components, which occur adjacent the end of the conduit 760 can extend the deposition zone beyond the area of the substrate directly in front of the end of conduit 760. The collar 764 should extend outward from its joinder to the conduit 760 a sufficient distance to preclude the back-mixing of ambient gases into the deposition zone due to a possible Venturi effect, and to assure that the entire area of the deposition zone, as it is extended by the previously noted edge effects, is protected from the backflow of ambient gases by the high velocity exhaust gases sweeping through the area between the collar and the substrate. The extended collar assures that contamination is prevented throughout the extended deposition zone. The diameter of the collar should be at least twice the internal diameter of conduit 760, and preferably, should be at least five times the internal diameter of conduit 760. The internal diameter of conduit 760 typically is in the range of 10 to 30 millimeters, and preferably is between 12 and 20 millimeters.

In operation, the collar 764 is located substantially parallel to the surface of the substrate 740 being coated and at a distance therefrom of 1 centimeter or less. Preferably, the facing surfaces of the collar and the substrate are between 2 and 5 millimeters apart. Spacing devices, such as three fixed or adjustable pins (not shown), may be provided on the collar to assist in maintaining the proper distance between the collar and the substrate.

The embodiment illustrated in FIG. 7 is particularly advantageous for applying coatings to substrates which are too large, or for which it is not convenient, to be treated in a specially controlled environment such as a vacuum chamber or a clean room. The illustrated coating technique is advantageous because it can be accomplished under atmospheric pressure conditions and at more convenient "in the field" locations. The series of concentric conduits 722, 738, 744, 752 and 760 form a coating head 768 which can be supplied by relatively small flexible tubes and can be sufficiently small to be portable. Large substrates can be coated either by having the coating head traverse the substrate repeatedly in a raster or similar pattern, or by traversing the substrate with an array of coating heads arranged to cumulatively provide a uniform coating, or by rastering an array of coating heads. In addition to permitting the thin film coating of articles which previously were too large to be coated, this technique permits the coating of larger units of those substrates which previously were coated under vacuum conditions. Manufacturing economies can be achieved by coating larger units of these substrates, especially when mass production of the substrates is involved.

The embodiment illustrated in FIGS. 7 and 8 is also particularly suitable for the production of coatings which are oxidation sensitive, such as most metal coatings. To provide such coatings the fuel is fed through conduit 744 in proximity to the atomized liquid media and coating precursor, while the oxidizer is fed through conduit 752. The atomizing gas fed through conduit 738 and/or the liquid media fed through conduit 722 can be materials having fuel value, they can be materials which react with the coating precursor or they can be inert materials. When the produced coatings or coating precursor materials are oxygen sensitive, a reducing atmosphere is maintained in the reaction and deposition zones by assuring that the total amount of oxidizer fed is restricted to an amount less than that required to filly combust the fuel provided to the reaction zone, i.e. the oxidizer is provided in less than stoichiometric amount. Generally, the fuel excess is limited so as to limit any flame zone which develops when the residual hot gases mix with atmospheric oxygen. When the produced coatings and the precursor materials are oxygen-tolerant or enhanced by the presence of oxygen, such as in the production of most of the oxide coatings, an oxidizing or neutral atmosphere may be provided in the reaction and deposition zones by feeding a stoichiometric or excess amount of oxidizer. Further, with oxygen tolerant reagents and products, the oxidizer can be fed through the inner conduit 744 while fuel is fed through outer conduit 752.

The inert gas supplied through conduit 760 must be sufficient to shield the inside surface of the conduit from the reactive gases produced in the reaction zone, and it must be sufficient, when added with the other gases from the reaction zone, to provide the gas velocity required in the barrier zone.

The energy input can be accomplished by mechanisms other than the combustion method illustrated in FIGS. 7 and 8. For instance, it could be accomplished by passing electrical current through conduit 722 to create electrical resistance heat in the conduit which then transfers to the liquid medium and coating precursor as it passes through the conduit. It should be apparent that all of the conduits 722, 738, 744, 752 and 760 are not required when the energy input is accomplished by other than the combustion method. Usually one or both of conduits 744 and 752 are omitted when the energy input is provided by one of the electrically derived energy input mechanisms.

The porosity or density of the deposited coating can be modified by varying the distance between the flame zone and the deposition zone at the substrate's surface. Generally, shortening of this distance provides an increased coating density, while increasing the distance provides a more porous coating.

In the illustrated CACCVD technique the reaction zone is generally coextensive with the flame produced by the burning fuel. Of course, the flame zone and the substrate must be maintained sufficiently far apart that the substrate is not damaged by the higher temperatures which would result as the flame zone more closely approaches the substrate surface. While substrate temperature sensitivity varies from one substrate material to the next, the temperature in the deposition zone at the substrate surface, typically, is at least 600° C. cooler than the maximum flame temperature.

When some of the alternate methods are used to supply the energy input, such as when the principal energy input is a preheated fluid which is mixed with the flowing stream in, or before it reaches, the reaction zone, the maximum temperatures produced in the reaction zone are substantially lower than those produced with a combustion energy input. In such cases the coating properties can be adjusted by varying the distance between the reaction zone and at the substrate surface with less concern for overheating the substrate. Accordingly, the terms reaction zone and deposition zone are useful in defining functional regions of the apparatus but are not intended to define mutually exclusive regions, i.e. in some applications reaction of the coating precursor may occur in the deposition zone at the substrate surface.

The lower maximum temperatures resulting when the principal energy input is other than a combustion flame enables the use of temperature sensitive coating materials, such as some organic materials. In particular, polymers may be deposited as protective coatings or as dielectric interlayer materials in capacitors, integrated circuits or microprocessors. For instance, a polyimide coating could be provided from its polyamic acid precursor. Similarly, polytetrafluoroethylene coatings could be provided from low molecular weight precursors.

The energy input to the flowing stream prior to its leaving the reaction zone generally negates the need to provide energy to the deposition zone by heating the substrate, as is often required in other coating techniques. In the present deposition system, since the substrate acts as a heat sink to cool the gases present in the deposition zone, rather than heating them, the temperatures to which the substrates are subjected are substantially less than are encountered in systems which require that energy be transmitted to the deposition zone through the substrate. Accordingly, the CACCVD coating process can be applied to many temperature sensitive substrate materials which can not be coated by techniques which involve heating through the substrate.

A wide range of precursors can be used as gas, vapor or solutions. It is preferred to use the lowest cost precursor which yields the desired morphology. Suitable chemical precursors, not meant to be limiting, for depositing various metals or metalloids are as follows:

Pt platinum-acetylacetonate [$Pt(CH_3COCHCOCH_3)_2$] (in toluene/methanol), platinum-($HFAC_2$), diphenyl-(1,5-cyclooctadiene) Platinum (II) [Pt(COD) in toluene-propane] platinum nitrate (in aqueous ammonium hydroxide solution)

Mg Magnesium naphthenate, magnesium 2-ethylhexanoate [$Ma(OOCCH(C_2H_5)C_4H_9)_2$], magnesium naphthenate, Mg-TMHD, Mg-acac, Mg-nitrate, Mg-2,4-pentadionate Si tetraethoxysilane [$Si(OC_2H_5)_4$], tetramethylsilane, disilicic acid, metasilicic acid P triethyl phosphate [$C_2H_5O)_3PO_4$], triethyllphosphite, triphenyl phosphite La lanthanum 2-ethylhexanoate [$La(OOCCH(C_2H_5)C_4H_9)_3$]lanthanum nitrate [$La(NO_3)_3$], La-acac, La-isopropoxide, tris (2,2,6,6-tetramethyl-3,5-heptanedionato), lanthanum [$La(C_{11}H_{19}O_2)_3$]

Cr chromium nitrate [$Cr(NO_3)_3$], chromium 2-ethylhexanoate [$Cr(OOCCH(C_2H_5)C_4H_9)_3$], Cr-sulfate, chromium carbonyl, chromium(III) acetylacetonate Ni nickel nitrate [$Ni(NO_3)_2$] (in aqueous ammonium hydroxide), Ni-acetylacetonate, Ni-2-ethylhexanoate, Ni-napthenol, Ni-dicarbonyl Al aluminum nitrate [$Al(NO_3)_3$], aluminum acetylacetonate [$Al(CH_3COCHCOCH_3)_3$], triethyl aluminum, Al-s-butoxide, Al-i-propoxide, Al-2-ethylhexanoate Pb Lead 2-ethylhexanoate [$Pb(OOCCH(C_2H_5)C_4H_9)_2$], lead naphthenate, Pb-TMHD, Pb-nitrate Zr zirconium 2-ethylhexanoate [$Zr(OOCCH(C_2H_5)C_4H_9)_4$], zirconium n-butoxide, zirconium ($HFAC_2$), Zr-acetylacetonate, Zr-n-propanol, Zr-nitrate Ba barium 2-ethylhexanoate [$Ba(OOCCH(C_2H_5)C_4H_9)_2$], Ba-nitrate, Ba-acetylacetonate, Ba-TMHD Nb niobium ethoxide, tetrakis(2,2,6,6-tetramethyl-3,5-heptanedionato) niobium Ti titanium (IV) i-propoxide [$Ti(OCH(CH_3)_2)_4$], titanium (IV) acetylacetonate, titanium-di-i-propoxide-bis-acetylacetonate, Ti-n-butoxide, Ti-2-ethylhexanoate, Ti-oxide bis(acetylacetonate)

Y yttrium 2-ethylhexanoate [$Y(OOCCH(C_2H_5)C_4H_9)_3$], Y-nitrate, Y-i-propoxide, Y-napthenoate Sr strontium nitrate [$Sr(NO_3)_2$], strontium 2-ethylhexanoate, Sr(TMHD)

Co cobalt naphthenate, Co-carbonyl, Co-nitrate,

Au chlorotriethylphosphine gold (I), chlorotriphenylphosphine gold(I)

B trimethylborate, B-trimethoxyboroxine

K potassium ethoxide, potassium t-butoxide, potassium 2,2,6,6-tetramethylheptane-3,5-dionate Na sodium 2,2,6,6-tetramethylheptane-3,5-dionate, sodium ethoxide, sodium t-butoxide Li lithium 2,2,6,6-tetramethylheptane-3,5-dionate, lithium ethoxide lithium-t-butoxide Cu Cu(2-ethylhexonate)$_2$, Cu-nitrate, Cu-acetylacetonate Pd paladium nitrate (in aqueous ammonium hydroxide solution) $(NH_4)_2Pd(NO_2)_2$, Pd-acetylacetonate, ammonium hexochloropalladium Ir $H_2IrCl_6$(in 50% ethanol in water solution), Ir-acetylacetonate, Ir-carbonyl Ag silver nitrate (in water), silver nitrate, silver fluoroacetic acid, silver acetate Ag-cyclohexanebutyrate, Ag-2-ethylhexanoate Cd cadmium nitrate (in water), Cd-2-ethylhexanoate Nb niobium (2-ethylhexanoate)

Mo $(NH_4)_6Mo_7O_{24}$, $Mo(CO)_6$, Mo-dioxide bis(acetylacetonate)

Fe Fe(NO$_3$)$_3$9H$_2$O, Fe-acetylacetonate
Sn SnCl$_2$2H$_2$O, Sn-2-ethylhexanoate, Sn-tetra-n-butyltin, Sn-tetramethyl
In In(NO$_3$)$_3$xH$_2$O, In-acetylacetonate
Bi Bismuth nitrate, Bismuth 2-ethyl hexonate
Ru Ru-acetylacetonate In most cases where a mixture of metal precursors and/or metalloid precursors are deposited, the deposition is generally stoichiometric with respect to the relative proportions of the metal(s) and/or metalloid(s) provided by the precursors in the reaction mixtures. However, this relationship is neither precise nor entirely predictable. Nevertheless, this does not present any significant problem in achieving a coating layer or powder of desired composition because the relative amounts of chemical precursors required to obtain a coating layer or powder of desired composition can be readily determined without undue experimentation for any set of coating parameters. Once a ratio of chemical precursors under a set of coating parameters is determined to obtain a coating or powder of desired composition, the coating can be duplicated with highly predictable results. Thus, if one desired a coating or powder that would contain two metals in a particular predetermined ratio, one might start out with two chemical precursors containing the two metals in the predetermined stoichiometric ratio. If determined that the two metals were not deposited in the predetermined ratio, adjustments would be made in the relative amounts of the two precursor chemicals until the desired ratio of metals in the deposited materials was achieved. This empirical determination would then be relied upon for future depositions.

CCVD has the advantages of being able to deposit very thin, uniform layers which may serve as the dielectric layers of embedded capacitors and resistors. For embedded resistors, the deposited layers are typically at least about 40 Å thick. The material can be deposited to any desired thickness; however, for forming resistive material layers by CCVD, thicknesses seldom exceed 50,000 Å (5 microns). Generally film thicknesses are in the 100–10,000 Å range, most generally in the 300–5000 Å range. Because the thinner the layer, the higher the resistance and the less material, e.g., platinum used, the ability to deposit very thin films is an advantageous feature of the CCVD process. The thinness of the coating also facilitates rapid etching in processes by which discrete resistors are formed.

Examples of coatings produced by CCVD include silicon dioxide coatings produced from a solution of tetraethoxysilane [Si(OC$_2$H$_5$)$_4$] in isopropanol and propane; platinum coatings produced from a solution of platinum-acetylacetonate [Pt(CH$_3$COCHCOCH$_3$)$_2$] in toluene and methanol; and nickel-doped LaCrO$_3$ coatings produced from solutions of lanthanum nitrate in ethanol, chromium nitrate in ethanol and nickel nitrate in ethanol.

The electrical resistance of a resistor is determined by the resistivity of the material, as well as the length and cross-sectional area of the resistor. While very thin films are desirable from the standpoint of material efficiency, where power loading (current flow) is high, thicker films may be required. For higher power loading requirements where thicker films are required, the resistivity of the material may need to be higher, e.g., by using more heavily doped metals as the resistive material.

Novel resistive materials can be deposited by CCVD and CACCVD such that very small, discrete electrical resistors can be formed by CCVD and CACCVD processes in conjunction with conventional or modified printed circuit board technology. The novel resistive materials are formed by the co-deposition by CCVD and CACCVD of conductive materials, particularly metals, such as platinum and nickel, with highly resistive (dielectric) materials, such as silica. It is found that a very small amount of the highly resistive material, e.g., about 0.1 wt % to about 20 wt %, very profoundly reduces the conductive properties of the conducting material. For example, platinum, though an excellent conductor, when co-deposited with between 0.1 and about 5 wt % silica, serves as a resistor, the resistance being a function of the level of silica co-deposited. While applicants are not bound by theory, it is believed that when a conductor and a minor amount of a non-conductor are co-deposited by CCVD or CACCVD, the non-conductor is deposited generally homogeneously throughout the conductor, either as single molecules or as nanoclusters of molecules.

For resistive material which is a mixture of a conductive metal and a minor amount of a dielectric material, to be deposited by CCVD or CACCVD, the metal must be capable of being deposited as a zero valence metal from an oxygen-containing system if the resistive material is to be deposited by CCVD or CACCVD. The criteria for deposition in the zero valence state using a flame is that the metal must have a lower oxidation potential than the lower of the oxidation potential of carbon dioxide or water at the deposition temperature. (At room temperatures, water has a lower oxidation potential; at other temperatures carbon dioxide has a lower oxidation potential.) Zero valence metals which can be readily deposited by CCVD are those having oxidation potentials about equal to silver or below. Thus, Ag, Au, Pt, and Ir can be deposited by straight CCVD. Zero valence metals having somewhat higher oxidation potentials may be deposited by CACCVD which provides a more reducing atmosphere. Ni, Cu, In, Pd, Sn, Fe, Mo, Co and Pb are best deposited by CACCVD. Herein, metals also include alloys that are mixtures of such zero-valence metals. The preferred dielectric materials being capable of co-deposition with the zero valence metals are metal oxides or metalloid oxides, such as silica, alumina, chromia, titania, ceria, zinc oxide, zirconia, phosphorous oxide, bismuth oxide, oxides of rare earth metals in general, and mixtures thereof. Silicon, aluminum, chromium, titanium, cerium, zinc, zirconium, magnesium, bismuth, rare earth metals, and phosphorous each have relatively high oxidation potentials, such that if any of the metals mentioned above are codeposited with the suggested precursors for electrically resistive material, the metals will deposit in zero valence state and the dopant will deposit as the oxide. Thus, even when no flame is used the dielectric needs to have a higher oxidation, phospidation, carbidation, nitrodation, or boridation potential to form the desited two phases.

Again, for more oxygen-reactive metals and alloys of metals, CACCVD may be the process of choice. Even if the metal can be deposited as a zero valence metal by straight CCVD, it may be desirable to provide a controlled atmosphere, i.e., CACCVD, if the substrate material on which it is to be deposited is subject to oxidation. For example, copper and nickel substrates are readily oxidized, and it may be desired to deposit onto these substrates by CACCVD.

Another type of resistive material which can be deposited as a thin layer on a substrate by CCVD is "conductive oxides". In particular, Bi$_2$Ru$_2$O$_7$ and SrRuO$_3$ are conductive oxides which may be deposited by CCVD. Although these materials are "conductive", their conductivity is relatively low when deposited in amorphous state; thus, a thin layer of such mixed oxides can be used to form discrete resistors. Like conductive metals, such "conductive oxides" may be doped with dielectric materials, such as metal or metalloid oxides, to increase their resistivity. Such mixed oxides may be deposited either as amorphous layers or as crystalline layers, amorphous layers tending to deposit at low deposition temperatures and crystalline layers tending to deposit at higher deposition temperatures. For use as resistors, amorphous layers are generally preferred, having higher resistivity than crystalline materials. Thus, while these materials are classified as "conductive oxides" in their normal crystalline state, the amorphous oxides, even in un-doped form, may produce good resistance. In some cases it may be desired to form low resistance, 1–100Ω, resistors and a conduction-enhancing dopant, such as Pt, Au, Ag, Cu or F, may be added. If doped with dielectric material, e.g., metal or metalloid oxides, to increase resistivity of the conducting oxides, or conduction-enhancing material to decrease resistivity of the conducting oxides, such homogeneously mixed dielectric or conduction-enhancing material is generally at levels between about 0.1 wt % and about 20 wt % of the resistive material, preferably at least about 0.5 wt %.

There are a variety of other "conducting materials" which though electrically conducting, have sufficient resistivity to form resistors in accordance with the present invention. Examples include yttrium barium copper oxides and $La_{1-x}Sr_xCoO_3$, $0 \leq x \leq 1$, e.g., x=0.5. Generally, any mixed oxide which has superconducting properties below a critical temperature can serve as electrically resistive material above such critical temperature. Deposition of such a variety of resistive materials is possible with proper selection of precursors selected from those described herein above.

To produce a metal/oxide resistive material film, precursor solution is provided which contains both the precursor for the metal and the precursor for the metal or metalloid oxide. For example, to produce platinum/silica films, the deposition solution contains a platinum precursor, such as platinum(II)-acetylacetonate or diphenyl-(1,5-cyclooctadiene) platinum (II) [Pt(COD)] and a silicon-containing precursor, such as tetraethoxysilane. The precursors are mixed generally according to the ratio of metal and enhancing material to decrease the resistivity of the material being deposited, an additional precursor is provided so as to produce minor amounts of the metal oxide or metalloid oxide, e.g., between 0.1 and 20 wt %, preferably at least about 0.5 wt %, of the deposited doped conducting metal oxide.

Either of the above-mentioned platinum precursors are soluble in toluene. Dissolving the platinum precursors is facilitated by sonification. To a solution of the platinum precursor, it is convenient to add tetraethyloxysilane dissolved in methanol, isopropanol or toluene to form a precursor solution. The precursor solution can then be further diluted to a desired concentration with propane or other organic solvents.

Generally, for shipping, storage, and handling, the precursor chemicals are dissolved in common liquid organic solvents, such as toluene, isopropanol, methanol, xylene, and mixtures thereof, to a concentration (of total precursor chemicals) of between about 0.25 and about 20 wt %, preferably at least about 0.5 wt % and typically up to about 5 wt %. Generally, for shipping and handling it is desired to provide concentrations in a concentrated form to minimize cost and minimize the quantity of flammable liquids. At the same time, stability, particularly low temperature stability, e.g., down to −20° C. must be consider, lest an overly concentrated solution precipitate from solution. At the time of deposition, the precursor solutions are typically further diluted, e.g., in propane, to a concentration (of total precursor chemicals) to between about 0.005 and about 1.0 wt %, preferably to between about 0.05 and about 1.0 wt %, more preferably no more than about 0.6 wt %.

One of the most important metals which can be deposited in doped or undoped form by CACCVD is nickel. Nickel is inexpensive and can be selectively etched relative to conductive metals, such as copper. An important precursor for depositing zero valence nickel by CACCVD is nickel nitrate. Nickel may be deposited from an ammoniacal aqueous solution of nickel nitrate. However, as described above, it is preferred that deposition be from a liquid at conditions approaching supercritical. To this end, advantageous carriers for nickel nitrate include liquefied ammonia or liquefied nitrous oxide ($N_2O$). Nitrous oxide may be liquefied by pressurizing to 700–800 psi. Ammonia may be liquefied by pressurization and/or low temperatures. Whether the carrier is liquefied ammonia or liquefied nitrous oxide, it is found advantageous to add a minor portion of water, i.e., up to about 40 wt %, preferably between about 2 to about 20 wt %, (the liquefied ammonia or liquefied nitrous oxide comprising the balance, between about 60 and about 100 wt %). The water raises the supercritical point of either liquefied ammonia or liquefied nitrous oxide. This makes it easier to operate sufficiently below the supercritical point such that variations in viscosity and density are not encountered. Also, the addition of water reduces the instability of the solutions. (It is to be understood, however, that depositions may, in some cases, be carried out in liquified ammonia or liquefied nitrous oxide without the addition of water.) In such nickel deposition solutions, the nickel precursor along with any precursor for a nickel dopant are typically present at a low level, i.e., from about 0.001 wt % to about 2.5 wt %. Currently preferred dopants for nickel are nickel phosphorous and/or nickel phosphorous oxides, e.g., nickel phosphate. It is believed that when using a phosphorus-containing precursor, such as phosphoric acid, the major dopant species is nickel phosphate. Precursor solutions in which water and either liquefied ammonia or $N_2O$ are the carrier co-solvents are advantageous in that no carbon is present which could result in deposition of carbon.

When preparing a precursor solution of nickel nitrate to be carried in liquefied ammonia, the nickel nitrate may be conveniently pre-dissolved in ammonium hydroxide solution along with precursor for any dopant, and this solution then admixed with liquefied ammonia.

The resistive materials described herein can be fabricated into resistors, either as embedded resistors, or as resistors on the surface of a printed circuit board within integrated circuits or other electronic applications. This is generally accomplished using a photoresist which is used to form a resist pattern over the layer of resistive material and using an appropriate etchant to remove the resistive material in areas not covered by the resist. For metal/oxide resistive material layers, the etchant chosen is an etchant for the metal component of the resistive material. Typically such etchants are acids or Lewis acids, e.g., $FeCl_3$ or $CuCl_2$ for copper. Nitric acid and other inorganic acids (e.g., sulfuric, hydrochloric, and phosphoric) may be used to etch nickel, a variety of other metals which may be deposited as well as conductive oxides.

Herein, it is proposed that Aqua Regia be used for etching noble metals, such as platinum. Aqua Regia is an extremely corrosive acid mixture which, herein, is useful for etching metals, particularly noble metals, such as platinum and gold. Au can also be etched in a potassium iodide/iodine ($KI/I_2$) solution. Because CCVD uses a flame, thereby tending to produce oxides, only the less reactive metals, i.e., those having low oxygen potentials, are easy to deposit as metals, rather than as oxides. Easiest to deposit are the noble metals, such as platinum and gold. While these metals are, of course, costly, CCVD can be advantageous in that it can be used to deposit very thin, but nevertheless uniform, films. Accordingly, deposition by CCVD of thin layers of noble metals is, in many cases practical. Furthermore, as noble metals are non-oxidizing, their use in high quality electronic applications may easily be economically justified.

Also, although noble metals are conductors, it is found that in depositing noble metals along with relatively minor amounts of oxides, such as silica or alumina, the deposited material becomes highly resistive. Accordingly, metals, such as platinum, containing minor amounts, e.g., 0.1%–5% of an oxide, can serve as resistors in printed circuit board. Such material can be deposited as a layer on a printed circuit board and then processed by printed circuit board techniques to provide discrete resistors.

However, noble metals, by their non-reactive nature, are difficult to etch, as is required in many processes for production of printed circuit boards. Herein, it is proposed to use aqua regia as an etchant for metals, particularly noble metals, in printed circuit board processes.

Aqua regia is made from two well-know acids: 3 parts concentrated (12M) hydrochloric acid (HCl) and 1 part concentrated (16M) nitric acid $HNO_3$. Thus, the molar ratio of hydrochloric acid to nitric acid is 9:4, although slight variations from this ratio, i.e., 6:4 to 12:4 would be acceptable for etching purposes in accordance with the invention. Because of its corrosive nature and limited shelf life, Aqua regia is not sold commercially, but must be prepared on site. To reduce its corrosiveness, the Aqua regia may be diluted with water up to about a 3:1 ratio of water to aqua regia. Dilution with water, of course, increases the etching time, but good etching times of platinum are achievable with a 33% aqua regia solution. Of course, more reactive metals, such as copper, will be easily etched as well by aqua regia. On the other hand, the noble metals, such as platinum, are not etched by many of the materials suitable for etching copper, such as $FeCl_3$ or $CuCl_2$, thereby allowing for a variety of selective etching options in forming printed circuit boards.

The speed of etching will depend upon several factors including the strength of the aqua regia and the temperature. Preferably the aqua regia is prepared fresh. Typically, aqua regia etching is conducted in the 55–60° range, although this may be varied depending upon the application.

The following discussion of formation of discrete resistors assumes the use of a platinum-based resistive material because platinum/silica is the currently preferred CCVD-deposited resistive material. However, it is to be understood that the other resistive materials, including both metal/oxide and conducting oxide films as described above, can be substituted. Likewise, in techniques described hereinafter in which copper and platinum-based resistive layers are selectively etched, it is to be understood that there are selective etchants available for a variety of conductor/resistive material combinations in accordance with the invention.

In its simplest form, a resistor 400 in accordance with the invention is merely a patch or strip 401 (FIGS. 4c and 4d) of the thin layer resist material on an insulating substrate 402 with means, such as a contacting copper patch 403 at each ends to provide for electrical connection of the resistor to electronic circuitry. The substrate 402 might be a flexible sheet, such as a polyimide sheet, a rigid epoxy/fiberglass board, or even liquid crystal sheet material. Suitable substrates desired for many applications are films of organic polymers, such as polyimide, having thicknesses of about 10 microns or less. After optimizing deposition parameters, it was found, herein, that CCVD can apply resistive material layers to insulating substrates, such as polyimide, without burning or deforming the substrates. Direct deposition of the resistive material layer on an insulating substrate generally provides good adhesion of the resistive material layer to the insulating substrate. Usually, such adhesion is better than prior art techniques which use an adhesive to bind a resistive material to a substrate. To form a discrete resistor 400, a thin layer of resist material 401(4a) is deposited by CCVD on an insulating substrate 402 to form the structure of FIG. 4a. A chemical-resistant photoresist, such as that sold by Morton Electronic Materials as Laminar 5038 which is resistive to aqua regia (in the case of platinum etching), is applied to the exposed surface of the resist material and patterned by conventional photoimaging techniques. Generally, a resist which will withstand very highly acidic conditions, such as gold-plating conditions, will be suitable as a resist for etching with aqua regia. The exposed portions of the resist material layer are then etched away, by aqua regia in the case of noble metal-based resist materials, leaving the patches or strips 401(4b) of resist material so as to form the structure of FIG. 4b. Copper connecting patches 403 may then be applied to the ends of the strips 401 to form the resistor 400 of FIG. 4c.

Figure 5A:
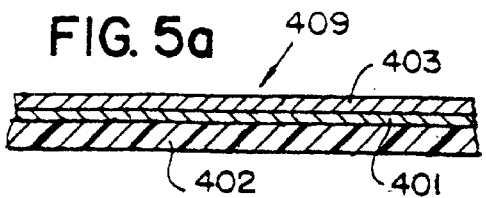
FIGS. 5a–5c are similar cross-sectional diagrams, illustrating steps of forming thin layer resistors in accordance with alternate processes of the invention.
Figure 5B:
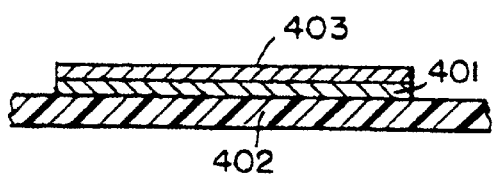
Figure 5C:
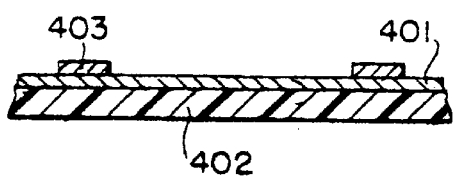

Preferably, however, in reference to FIGS. 5a–5c, both the thin layer resist material patches 401 and the electrical connection conductive patches 403 are formed by photoimaging techniques. Shown in FIG. 5a is a three-layer structure 409 which comprises an insulating substrate 402, a layer of resist material 401(5a), e.g., Pt/silica, formed in accordance with the invention by CCVD and a conductive layer 403 (5a), e.g., copper, formed by CCVD or another technique, such as electrolytic plating.

The structure 409 of FIG. 5a might be patterned in one of two two-step procedures by photoimaging technology. In one procedure (with reference to FIG. 5b), the conductive material layer 403(5a) would be covered with a resist, the resist patterned by photoimaging techniques, and, in the exposed areas of the resist, both the conductive material layer and the underlying resistive material layer be etched away, e.g., with aqua regia to give the structure of FIG. 5b having a patterned resistive material patch (401(5b)) and a patterned conductive material patch (403(5b)). Next, a second resist would be applied, photoimaged, and developed. This time, only the exposed portions of the conductive material patch 403(5b) would be etched away by etchant which would selectively etch the conductive layer, but not the resistive material patch, i.e., $FeCl_3$ or $CuCl_2$ in the case of Cu as the conductive material layer and Pt/silica as the electrically resistive material, thereby producing the resistor structure 400 of FIG. 4c. In an alternate procedure (with reference to FIG.5c), a patterned resist layer would be formed, exposed portions of the conductive material layer 403(5a) etched away, e.g., with $FeCl_3$, a further patterned resist layer formed, and then the exposed areas of the resistive material layer (401(5b)) etched away with aqua regia so as to form the electrical contacts 403 and give the resistor structure 400 of FIG. 4c. By either procedure, discrete thin layer resistors 400 are formed by conventional photoimaging techniques common to printed circuitry formation.

Figure 4A:
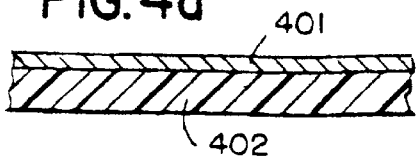
FIGS. 4a–4c show in cross-sectional diagrams, steps of forming a thin layer resistor in accordance with the present invention.
Figure 4B:
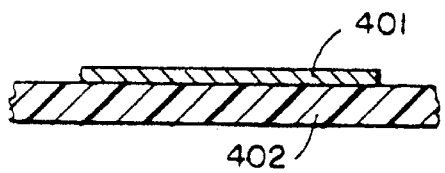

Still another way of forming discrete resistors is to start with a two-layer structure such as that shown in FIG. 4a having a layer of resistive material, e.g., Pt/silica, on an insulating substrate. Using a photoresist process, discrete patches or strips of the resistive material are formed on the substrate, giving a structure such as that shown in FIG. 4b. Next, a layer of conductive material, e.g., copper, is formed on the resistive patches or strips, e.g., by electrolytic plating, giving a structure such as is shown in FIG. 5b. A further photoresist is applied and imaged, and exposed portions of the conductive material are then etched away so as to leave the conductive electrical connection patches 403 and provide a resistor structure 400 such as is shown in FIG. 4c.

Figure 4C:
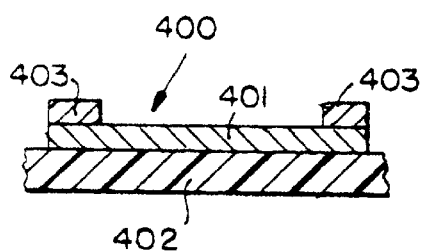
Figure 4D:
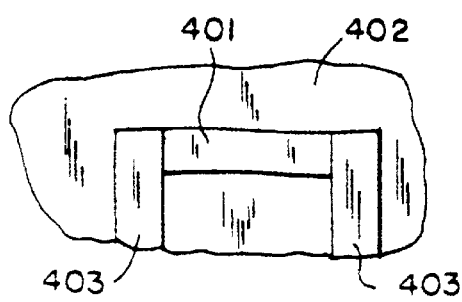
FIG. 4d is a plan view of the thin layer resistor of FIG. 4c.
Figure 6:
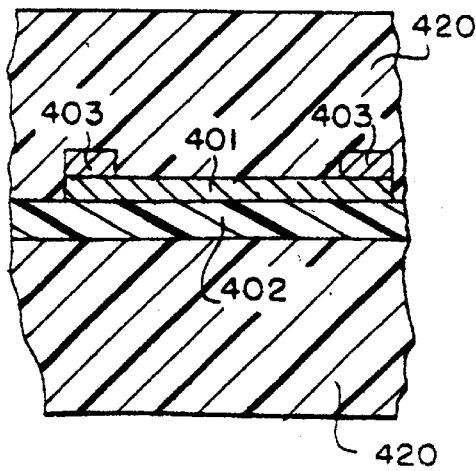
FIG. 6 is a cross-sectional view of the resistor of FIG. 4c embedded in insulating material.

While the resistor 400 of FIG. 4c could be at the surface of a printed circuit board device, the resistors will, in most cases, be embedded within a multi-layer printed circuit board as shown in FIG. 6 where the resistor 400, which was formed on an insulating substrate 402, such as polyimide, is embedded within additional insulating material layers 420, such as epoxy/fiberglass prepeg material.

Figure 9A:
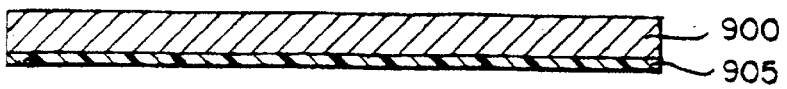
FIGS. 9a–9g are cross-sectional views of structures representing a process for fabricating a resistor from a free-standing foil coated with an electrically resistive material.

Illustrated in FIGS. 9 a–g are cross-sectional views representing a circuitization process which begins with a conductive foil 900, such as a copper foil, to which a layer of electrically resistive material 905 has been deposited by CCVD or CACCVD, this two-layer structure being represented in FIG. 9a. Copper foil useful in this process is typically between about 3 and about 50 microns thick.

Photoresist layers 910 and 915 are then applied to both sides of the two-layer structure. The photoresist 910 covering the resistive material layer 905 is exposed to patterned actinic radiation while the photoresist 915 covering the conductive foil 900 is blanket-exposed to actinic radiation. The photoresists are then developed, giving the structure of FIG. 9b with a patterned photoresist layer covering the resistive material layer 905 and the blanket-exposed photoresist layer 915 protecting the conductive foil.

Figure 9B:
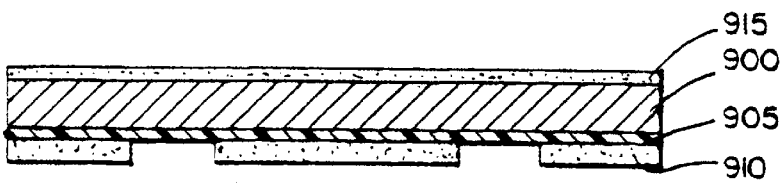
Figure 9C:
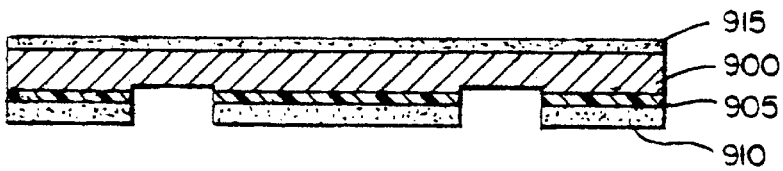

As shown in FIG. 9c, the resistive material layer 905 is then selectively etched from areas where the photoresist 910 had been removed. Subsequently, the remaining photoresist 910, 915 is stripped.

Figure 9D:
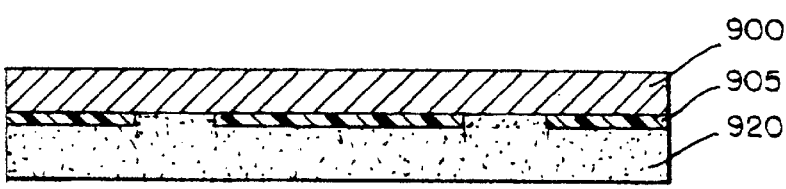
Figure 9E:
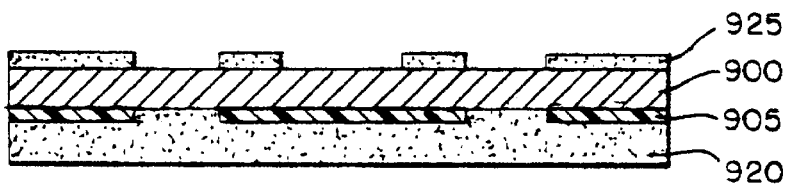
Figure 9F:
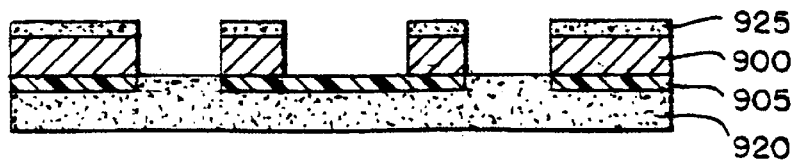
Figure 9G:
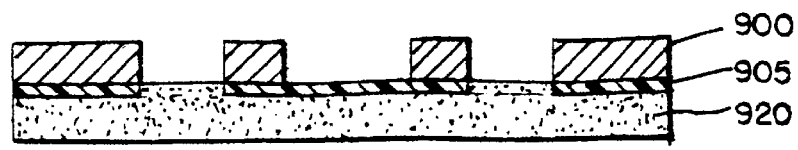

Following this, as shown in FIG. 9d, an organic laminate 920 is applied to the resistive material side of the structure. The laminate protects the now-patterned resistive material layer 905 from further processing and subsequently supports patches of the resistive material layer 905 when portions of the conductive foil is subsequently removed from the other side of the resistive material layer.

Next, a photoresist layer 925 is applied to the conductive foil 900. This is imaged with patterned actinic radiation and developed, giving the structure shown in FIG. 9e. Following this, the conductive foil 900 is etched with an etchant which selectively etches the conductive foil 900 but which does not etch the resistive material layer 905, leaving the structure shown in FIG. 9f Stripping of the photoresist 925 leaves the resisttor structure shown in FIG. 9g. This structure may subsequently be embedded in dielectric material (not shown).

As a variation of this process, it should be noted that if an etchant is used which selectively etches the electrically resistive material layer 905 but does not etch or only partially etches the conductive foil 900, the use of resist layer 915 (FIGS. 9b and 9c) is not necessary.

When referring herein to "etching", the term is used to donate not only the common usage in this art where a strong chemical dissolves the material of one of the layers, e.g., nitric acid dissolves nickel, but also physical removal, such as laser removal and removal by lack of adhesion. In this regard, and in accordance with an aspect of this invention, it is found that resistive materials, such as doped nickel and doped platinum, deposited by CCVD or CACCVD are porous. The pores are believed to be small, typically of a diameter of a micron or less, preferably of a diameter of 50 nanometers or less (1000 nanometers=1 micron). Nevertheless, this permits liquid etchants to diff-use through the electrically resistive material layer and, in a physical process, destroy the adhesion between the resistive material layer and the underlying layer.

For example, in reference to FIGS. 9b and 9c, if the conductive foil layer 900 is copper and the resistive material layer 905 is doped platinum, e.g., Pt/silica, or doped nickel, e.g., $Ni/PO_4$, cupric chloride could be used to remove exposed portions of the resistive material layer. The cupric chloride does not dissolve either Pt or Ni, but the porosity of the resistive material layer allows the cupric chloride to reach the underlying copper. A small portion of the copper dissolves and the exposed portions of the electrically resistive layer 905 by physical ablation. This physical ablation occurs before the cupric chloride etches the underlying copper layer 900 to any significant extent.

By the same token, the porosity of the resistive materials deposited in accordance with the invention may be removed by ablative etching. For example, a platinum layer on a polyimide substrate may be etched using etchants, such as those described above with respect to removing a resistive layer from a conductive copper substrate, particularly inorganic acids such as hydrochloric acid, sulfuric acid and acidic cupric chloride. Thus, in processes, such as heretofore described using common photoresist techniques, discrete resistors may be formed by etching thin films of resistive materials on insulating substrates, such as polyimide films.

If copper is the conductive material layer 900, it is sometimes advantageous to use copper foil that has been oxidized; oxidized copper foil is commercially available. An advantage of an oxidized copper foil is that a dilute HCl solution, e.g., ½%, dissolves copper oxide without dissolving zero valence copper. Thus, if the electrically resistive material layer is porous, such that the dilute HCl solution diffuses therethrough, HCl can be used for ablative etching. Dissolving the surface copper oxide destroys the adhesion between the copper foil and the electrically resistive material layer. As noted above with respect to the process shown in FIGS. 9a–9g, the use of such an etchant which does not attack the foil dispenses with the need for protective photoresist layer 915 (FIGS. 9b and 9c).

To minimize processing steps, the photoresists applied can be embedable in materials, such as Morton International's permanent etch resist. Then both sides can be processed simultaneously if the etchant does not or only partially etches the conductor. In particular, only the resistor material side photoresist needs to be embeddable and the conductor side can be removed as a final processing step. Alternatively, the photoresists used on the conductor material side can be selected such that it is not removed with a specific stripper used to remove the resistor material side photoresist. Embedable photoresist may decrease tolerance losses due to particular undercutting of resistor material which under cut material will ablate once the photoresist is removed.

It can be demonstrated that when using porous electrically resistive material layers, such as doped platinum and doped silica, with certain etchants, the etching process is a physical ablation process. This is because flakes of the electrically resistive material layer are found in the etchant bath. Because of this, separation of the ablated resistive material can be separated from the etchant bath by physical means, such as filtration, settling, centrifugation, etc. This is particularly convenient for recovering expensive material, such as platinum.

To be practically removable by an ablative technique, the resistive material layer must generally be sufficiently porous to an etchant which does not dissolve the electrically resistive material but sufficiently attacks the surface of the underlying material such as to result in loss of interfacial adhesion and ablation of the electrically conductive material within about 2 to 5 minutes. At the same time, such etchant must not substantially attack the underlying material, e.g., copper foil, during the etching period as such would cause excessive undercutting or loss of mechanical strength (i.e., reduce handleability).

The invention will now be described in greater detail by way of specific examples.

EXAMPLE 1

A layer of $Pt/SiO_2$ resistive material was deposited by CCVD on polyimide using deposition conditions as follows:

| Solution preparation: | 1.23 g Pt(COD) | |
|---|---|---|
| | 250 ml toluene | |
| | 0.43 g TEOS (1.5 wt % Si in toluene) | |
| | 150 g propane | |
| Deposition conditions: | Solution flow: | 3 ml/min |
| | Deposition time: | ~18 min for 5" × 6" substrate |
| | # of passes: | 6 |
| | Deposition temp. | 500° C. |
| | Variac | 3.0 A |
| | Tip Oxygen flow: | ~2900 ml/min |

The sample described by the deposition conditions above yielded a resistance value of ~17 ohms per square.

This is an example of a 65% concentrated solution with 2.5 wt % $SiO_2$. The variables that can be changed include the amount of Pt(COD) and TEOS added proportionally to reach concentrations to 100% solution (e.g., 1.89g Pt(COD) and 0.65g TEOS (1.5 wt % Si)) and the amount of TEOS that can be added to change the resulting weight % $SiO_2$(typically 0.5–5 wt % are used for this project).

EXAMPLE 2

In some cases, there will be the need to deposit certain materials onto oxidation sensitive substrates without oxidizing the substrate. This can be done using the CACCVD technique, and the deposition of the dielectric compound $SrTiO_3$ onto Ni is one example. This deposition uses the traditional CCVD nozzle which is placed in a jacket that can supply inert or reducing gases around the flame. This jacketed nozzle is then housed in a quartz tube to prevent air from reaching the substrate during the deposition as shown in FIG. 8. For this CACCVD flame, a combustible solution flows through the needle as in the CCVD process, oxygen flows through the tip, and hydrogen flows through the pilot tubes. High flows of inert (such as argon or nitrogen) or reducing gases (such as 90–99.5% argon/ 10–0.5% hydrogen) flow through the jacket around the flame. For very small samples, a side arm purged with an inert or reducing gas is part of the quartz tube to allow a heated sample to cool in a controlled atmosphere after the deposition and therefore prevent oxidation at this point. This process has allowed $SrTiO_3$ to be deposited onto Ni without forming NiO or without depositing carbon as far as EDX and XRD analysis have indicated. Early experiments have shown that solvents with a low carbon deposition potential such as methanol are better to use than toluene. Carbon was deposited onto the substrate when toluene was used. The ideal processing parameters to date are given below.

| Solution preparation: | 0.82 g Sr 2-ethylhexonate (1.5 wt % Sr in toluene) | |
|---|---|---|
| | 0.73 g Ti -di-i-acac (0.94 wt % Ti in toluene) | |
| | 17 ml methanol | |
| | 100 g propane | |
| Deposition conditions: | Solution flow: | 2 ml/min |
| | Deposition time: | 15 min. (has varied from 10–15 min) |
| | Deposition temp. | ~950° C. (has varied from 800–1050° C.) |
| | Variac | 1.9 A (has varied from 1.9–2.25 A) |
| | Pilot Hydrogen flow: | ~1926 ml/min (has been as low as 550 ml/m) |
| | Tip Oxygen flow: | ~1300 ml/min (has varied from 500–2322 ml/m) |
| | Reducing gas mix: | 0.5–10% hydrogen/balance argon |
| | Reducing gas flow: | 58 l/min |

EXAMPLE 3

A phosphate-doped nickel film was deposited onto 200TAB-E, polyimide substrates utilizing a solution of 0.760 g $Ni(NO_3)$-$H_2O$ and 0.30 g $H_3PO_4$ in 400 ml 6M $NH_4OH$ using the apparatus described in FIG. 7. The solution was flowed through a 22 ga. stainless steel needle with a 22 µm ID (0.006" OD) fused silica capillary insert (3 mm long) at the tip 722, at a flow rate of 0.50 sccm. Hydrogen gas was passed through the surrounding tube 738 at a rate of 1.20 lpm. Hydrogen was passed through the tube 744 surrounding that at a rate of 756 sccm. Oxygen gas was passed through the tube 752 surrounding that at a rate of 1.40 lpm. Argon gas was passed through the outer tube 768 at a rate of 28.1 lpm. All flows were started prior to manual ignition of the flame. Generally, the argon flow had to be reduced for the flame front to ignite the inner nozzle. The argon flow was then returned to its initial setting. Once lit, no pilot or ignition source was required to maintain combustion. The gas temperature at approximately 1 mm above the deposition point was 500° C. The substrate was rastered at 2 mm from the nozzle collar at 20"/min with 0.0625" steppings traversing an area of 3.5" by 3.5" once with horizontal sweeps. The total time required for this rastering motion was 12 minutes.

The linear resistance of the deposited phosphate-doped nickel layer was 115 Ω/in.

For comparison, the deposition was repeated with a solution which did not contain the phosphoric acid. The resistance of the nickel layer was 5 Ω/in.

EXAMPLE 4

$Bi_2Ru_2O_7$ was deposited using the following chemicals and process parameters:

Precursor solution:

0.0254 wt % of Bi in 2-ethylhexanoate+0.0086 wt % of Ru in acetylacetonate+1.8026 wt % methanol+15.0724 wt % of toluene+83.0910 wt % of propane.

Parameters:

Flow rate of precursor solution: 3 ml/min.

Tip oxygen flow rate: 4 l/min.

Variac: 2.30 A.

No back cooling.

Deposition temperature: 250–650° C.

Amorphous $Bi_2Ru_2O_7$ was coated at 400° C. gas temperature and the electrical resistivity was less than 7200 $\mu\Omega\cdot cm$; this is the best mode to date. Propane and toluene were used as solvents. To prepare concentrated or diluted solution for deposition, toluene ranging from 1 to 35 wt % can be used. Propane in the range of 99 to 65 wt % can also be utilized. By changing the solvent weight percentages, the concentrations of solutes (Bi-2-ethylhexanoate and Ru-acetylacetonate) can be adjusted accordingly. Flow rate of precursor solution can range from 1–5 ml/min.

EXAMPLE 5

$SrRuO_3$ was deposited using the following chemicals and process parameters:

Precursor solution:

0.0078 wt % of Sr in 2-ethyihexanoate+0.0090 wt % of Ru in acetylacetonate+12.7920 wt % of toluene+87.1912 wt % of propane.

Parameters:

Flow rate of precursor solution: 3 ml/min.

Tip oxygen flow rate: 4 l/min.

Variac: 2.75 A.

No back cooling.

Deposition temperature: 300–650° C.

Amorphous $SrRuO_3$ was coated at 400° C. gas temperature and the electrical resistivity was less than 5400 $\mu\Omega\cdot cm$; this is the best mode to date. Propane and toluene were used as solvents. To prepare concentrated or diluted solution for deposition, toluene ranging from 1 to 35 wt % can be used. Propane in the range of 99 to 65 wt % can also be utilized. By changing the solvent weight percentages, the concentrations of solutes (Sr-2-ethylhexanoate and Ru-acetylacetonate) can be adjusted accordingly. Flow rate of precursor solution can range from 1–5 ml/min.

EXAMPLE 6

Method One: Formation of Singular Discreet Resistors

On a polyimide sheet, 25 microns thick, there was deposited a 200 nanometer thick platinum/silica layer (Pt: $SiO_2$, 97.5:2.5) according to the method of (Example 1). To the platinum layer was laminated a photo resist, Laminar 5000 Series, sold by Morton International Electronics Materials. The resist layer was covered with a photo tool, and the uncovered portions of the resist layer exposed with 70 millijoules of UV light. The unexposed resist was then removed by developing in a 1% sodium carbonate monohydrate solution at 80° F. using a conveyorized spray developer at about 25 psi with a residence time adjusted so that the breakpoint occurred at 40% to 50% of the chamber length, followed by several spray rinses using tap water and deionized water.

Next, the sheet was exposed to a 50% solution of aqua regia (500 ml $H_2O$+125 ml $HNO_3$+375 ml HC) solution at 50° C. for a sufficient time to remove all of the Pt/$SiO_2$ material in those regions from which the resist had been removed thus forming the discreet resistors.

EXAMPLE 7

Method Two: Formation of Singular Discreet Resistors with Copper Connecting Circuits On a polyimide sheet, 25 microns thick, there was deposited a 200 nanometer thick platinum/silica layer (Pt:$SiO_2$, 97.5:2.5) according to the method of (Example 1). Copper was then plated directly to the surface of the Pt/$SiO_2$ layer to a thickness of 12 microns using a commercial vendor supplied acid copper plating bath using standard vendor supplied plating parameters. To the plated copper layer was laminated a photo resist, Laminar 5000 Series, sold by Morton International Electronics Materials. The resist layer was covered with a photo tool, and the uncovered portions of the resist layer exposed with 70 millijoules of UV light. The unexposed resist was then removed by developing in a 1% sodium carbonate monohydrate solution at 80° F. using a conveyorized spray developer at about 25 psi with a residence time adjusted so that the breakpoint occurred at 40% to 50% of the chamber length, followed by several spray rinses using tap water and deionized water.

Next, the sheet was exposed to a 50% solution of aqua regia (500 ml $H_2O$+125 ml $HNO_3$+375 ml HCl.) solution at 50° C. for a sufficient time to remove all of the plated copper and the Pt/$SiO_2$ material in those regions from which the resist had been removed, thus forming the electronic circuit pattern. The photo resist was removed in a 3% solution at 130° F. of sodium hydroxide using a conveyorized spray resist stripper at about 25 psi with a residence time adjusted so that the breakpoint occurred at 40% to 50% of the chamber length, followed by several spray rinses using tap water and deionized water.

To the circuitized electronic pattern was laminated a photo resist, Laminar 5000 Series, sold by Morton International Electronics Materials. The resist layer was covered with a photo tool, and the uncovered portions (all areas other than the area of the discreet resistors) of the resist layer exposed with 70 millijoules of UV light. The unexposed resist was removed by developing in a 1% sodium carbonate monohydrate solution at 80° C. using a conveyorized spray developer at about 25 psi with a residence time adjusted so that the breakpoint occurred at 40% to 50% of the chamber length, followed by several spray rinses using tap water and deionized water. The exposed copper area was then etched in a cupric chloride commercial bendor supplied etchant to remove only the copper leaving the Pt/$SiO_2$ exposed and unetched, thus forming the resistors connected at each end by copper circuit traces. The photo resist is removed in a 3% solution at 130° F. of sodium hydroxide using a conveyorized spray resist stripper at about 25 psi with a residence time adjusted so that the breakpoint occurred at 40% to 50% of the chamber length, followed by several spray rinses using tap water and deionized water.

EXAMPLE 8

Method Three: Formation of Singular Discreet Resistors with Copper Connecting Circuits On a polyimide sheet, 25 microns thick, there was deposited a 200 nanometer thick platinum/silica layer (Pt: $SiO_2$, 97.5:2.5) according to the method of (Example 1). Copper was then plated directly to the surface of the Pt/$SiO_2$ layer to a thickness of 12 microns using a commercial vendor supplied acid copper plating bath and plating parameters. To the plated copper layer was laminated a photo resist, Laminar 5000 Series, sold by Morton International Electronics Materials. The resist layer was covered with a phototool, and the uncovered portions of the resist exposed with 70 millijoules of UV light. The unexposed resist was then removed by developing in a 1% sodium carbonate monohydrate solution at 80° F. using a conveyorized spray developer at about 25 psi with a residence time adjusted so that the breakpoint occurred at 40% to 50% of the chamber length, followed by several spray rinses using tap water and deionized water.

The copper was then etched in a cupric chloride vendor supplied etchant exposing the $Pt/SiO_2$. The resist was stripped and a new layer of photo resist (Laminar 5000 Series) applied using an industry standard vacuum lamination process. A second photo mask having line widths two mils wider than the original patter was used to expose the second pattern using identical exposure parameters as used in the original resist expose operation.

Next, the sheet was exposed to a 50% solution of aqua regia (500 ml $H_2O$+125 ml $HNO_3$+375 ml HCl) solution at 50° C. for a sufficient time to remove all of the exposed $Pt/SiO_2$ material in those regions from which the resist had been removed thus forming the electronic circuit pattern. The photo resist was removed in a 3% solution at 130° F. of sodium hydroxide using a conveyorized spray resist stripper at about 25 psi with a residence time adjusted so that the breakpoint occurred at 40% to 50% of the chamber length, followed by several spray rinses using tap water and deionized water.

To the sheet was laminated a third new photo resist layer, Laminar 5000 Series, sold by Morton International Electronics Materials. The resist layer was covered with a phototool, and the uncovered portions (all areas other than the area of the discreet resistors), exposed with 70 milijoules of UV light. The unexposed resist was then removed by developing in a 1% sodium carbonate monohydrate solution at 80° C. using a conveyorized spray developer at about 25 psi with a residence time adjusted so that the breakpoint occurred at 40% to 50% of the chamber length, followed by several spray rinses using tap water and deionized water. The exposed copper area was then etched in a commercial vendor supplied cupric chloride etchant to remove only the copper leaving the $Pt/SiO_2$ exposed and unetched, thus forming the resistors connected at each end by copper circuit traces. The photo resist is again removed in a 3% solution at 130° F. of sodium hydroxide using a conveyorized spray resist stripper at about 25 psi with a residence time adjusted so that the breakpoint occurred at 40% to 50% of the chamber length, followed by several spray rinses using tap water and deionized water.

What is claimed is:

1. A method of forming a resistor comprising a patch of electrically resistive material and patches of a layer of conductive material in electrical contact with said patch of resistive material at spaced apart locations, the method comprising,
  a) providing a metal foil layer,
  b) providing a layer of electrically resistive material adhered to said metal foil layer,
  c) covering selected portions of said resistive layer) with photoresist,
  d) etching non-covered portions of said resistive layer from, said metal foil layer),
  e) removing remaining photoresist,
  f) laminating a polymeric support material to the resistive material side of said structure,
  g) covering selected portions of said metal foil layer with photoresist on the side of said foil layer opposite resistive layer, and
  h) etching non-covered portions of said foil layer.

2. The method in accordance with claim 1 wherein a protective layer is provided to the exposed surface of said metal foil layer prior to step d) and said protective layer is removed at some point prior to step g).

3. The method in accordance with claim 1 wherein said metal foil layer is copper.

4. The method in accordance with claim 1 wherein said electrically resistive layer is a metal doped with a dielectric.

5. The method in accordance with claim 1 wherein said resistive material layer is doped platinum.

6. The method in accordance with claim 1 wherein said resistive material layer is doped nickel.

7. The method in accordance with claim 1 wherein said resistive material layer is a conductive oxide.

8. The method in accordance with claim 1 wherein said resistive material layer is sufficiently porous that an etchant may diffuse through said resistive material layer and impair the adhesion of said resistive material layer to said metal foil layer, and sufficiently ablate etchant-exposed portions of said resistive material layer from said metal foil layer.

9. The method in accordance with claim 8 wherein said resistive material layer is doped platinum.

10. The method in accordance with claim 8 wherein said resistive material layer is doped nickel.

11. The method in accordance with claim 8 wherein said metal foil layer is copper.

12. The method in accordance with claim 11 wherein the surface of said copper metal foil layer is oxidized.

13. The method in accordance with claim 8 wherein said resistive material is platinum doped with a metal oxide or a metalloid oxide.

14. The method in accordance with claim 8 wherein said resistive material is platinum doped with silica.

15. The method in accordance with claim 8 wherein said resistive material is nickel doped with a metal oxide or a metalloid oxide.

16. The method in accordance with claim 8 wherein said resistive material is nickel doped with silica.

* * * * *